(12) United States Patent
Mak et al.

(10) Patent No.: US 9,478,835 B2
(45) Date of Patent: Oct. 25, 2016

(54) INTEGRATED ELECTRODE ARCHITECTURES FOR ENERGY GENERATION AND STORAGE

(75) Inventors: Wai Fatt Mak, Singapore (SG); Tsyh Ying Grace Wee, Singapore (SG); Teddy Salim, Singapore (SG); Madhavi Srinivasan, Singapore (SG); Subodh Mhaisalkar, Singapore (SG); Yin Chiang Freddy Boey, Singapore (SG)

(73) Assignee: Nanyang Technological University, Singapore (SG)

( * ) Notice: Subject to any disclaimer, the term of this patent is extended or adjusted under 35 U.S.C. 154(b) by 1254 days.

(21) Appl. No.: 13/391,243

(22) PCT Filed: Aug. 20, 2009

(86) PCT No.: PCT/SG2009/000288
§ 371 (c)(1),
(2), (4) Date: May 2, 2012

(87) PCT Pub. No.: WO2011/021982
PCT Pub. Date: Feb. 24, 2011

(65) Prior Publication Data
US 2012/0219831 A1    Aug. 30, 2012

(51) Int. Cl.
*H01M 12/00*    (2006.01)
*B82Y 10/00*    (2011.01)
(Continued)

(52) U.S. Cl.
CPC .............. *H01M 12/00* (2013.01); *B82Y 10/00* (2013.01); *H01L 25/047* (2013.01); *H01L 27/301* (2013.01); *H01L 31/053* (2014.12); *H01L 35/04* (2013.01); *H01M 4/38* (2013.01);
(Continued)

(58) Field of Classification Search
CPC ... B82Y 10/00; H01L 25/047; H01L 27/301; H01L 35/04; H01L 2924/0002; H01L 51/0036; H01L 51/0048; H01L 51/4253; H01L 2924/09701; H01M 4/38; H01M 4/48; H01M 12/00; H01M 12/005; H01M 12/04; H01M 14/005; Y02E 10/542
USPC .......................................................... 429/9
See application file for complete search history.

(56) References Cited

U.S. PATENT DOCUMENTS 6,117,585 A    9/2000  Anani et al.
6,911,273 B2   6/2005  Faris
(Continued)

*Primary Examiner* — Gary Harris
(74) *Attorney, Agent, or Firm* — Seed IP Law Group PLLC

(57) ABSTRACT

The present invention is directed to a hybrid device comprising: an energy converting unit comprising a first electrode, a second electrode and an energy converting medium arranged between the first electrode and the second electrode, wherein the energy conversion takes place between the first electrode and the second electrode; an energy charge storing unit comprising a first electrode, a second electrode and an electrolyte medium; wherein the energy charge is stored between the first and the second electrode; the second electrode of the energy converting unit and the second electrode of the energy charge storing unit being a shared electrode electrically connecting the energy converting unit and the energy charge storing unit; and wherein the shared electrode comprises a metal and a nanostructured material. The present invention is also directed to a method of manufacturing such a hybrid device.

47 Claims, 14 Drawing Sheets

(51) Int. Cl.
  *H01L 25/04* (2014.01)
  *H01L 27/30* (2006.01)
  *H01L 35/04* (2006.01)
  *H01M 4/38* (2006.01)
  *H01M 4/48* (2010.01)
  *H01M 12/04* (2006.01)
  *H01M 14/00* (2006.01)
  *H01L 31/053* (2014.01)
  *H01L 51/00* (2006.01)
  *H01L 51/42* (2006.01)

(52) U.S. Cl.
  CPC ........... *H01M 4/48* (2013.01); *H01M 12/005* (2013.01); *H01M 12/04* (2013.01); *H01M 14/005* (2013.01); *H01L 51/0036* (2013.01); *H01L 51/0048* (2013.01); *H01L 51/4253* (2013.01); *H01L 2924/0002* (2013.01); *H01L 2924/09701* (2013.01); *Y02E 10/542* (2013.01); *Y02P 70/521* (2015.11)

(56) References Cited

U.S. PATENT DOCUMENTS

| | | | |
|---|---|---|---|
| 6,998,184 B2 | 2/2006 | Venkatesan et al. | |
| 2004/0241532 A1 | 12/2004 | Kim | |
| 2005/0202290 A1* | 9/2005 | Merzougui | H01M 4/242 429/9 |
| 2009/0303660 A1* | 12/2009 | Nair | H01G 11/46 361/502 |

* cited by examiner

FIG. 23
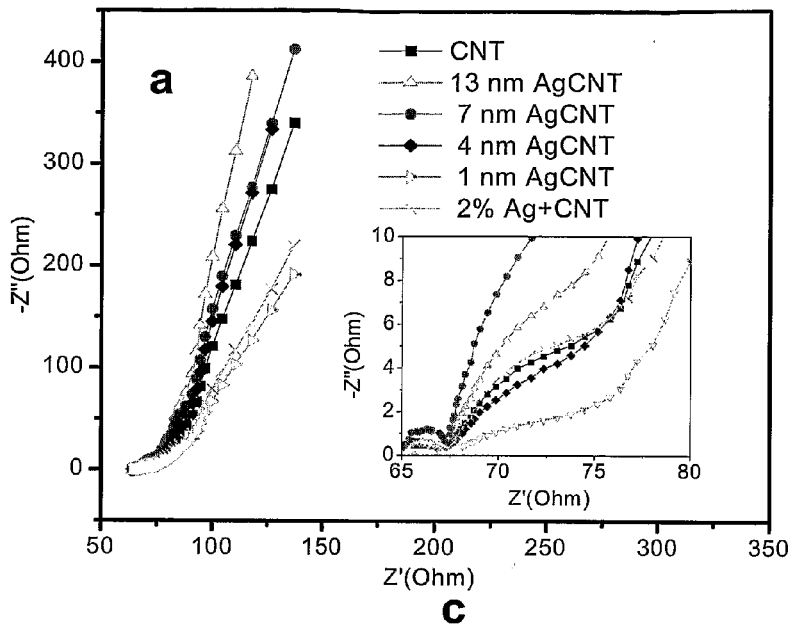
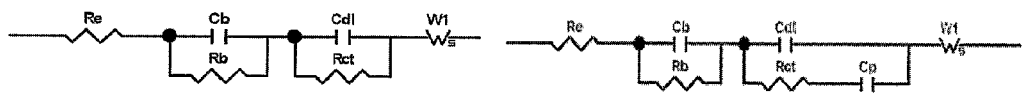
FIG. 24
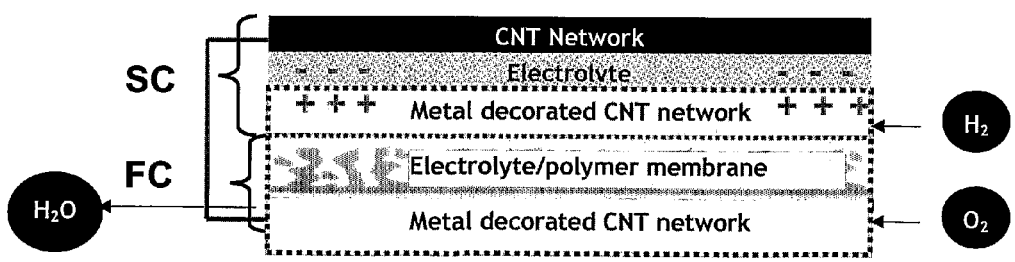

US 9,478,835 B2

INTEGRATED ELECTRODE ARCHITECTURES FOR ENERGY GENERATION AND STORAGE

FIELD OF THE INVENTION

The present invention refers to the field of electrochemistry and electrical engineering.

BACKGROUND OF THE INVENTION

Harvesting solar energy directly utilizing energy converters, such as energy converters using photovoltaic technology is currently considered as an essential component for future global energy production. Organic photovoltaic (OPV) devices are also recognized as a viable option for low-cost power conversion technology to compete with the currently existing silicon-based photovoltaic devices. However, the low power conversion efficiency of OPV devices has limited their existence in the market competitively as a stand-alone device. Integrating OPV with energy storage devices such as supercapacitors and batteries thus offer a promising alternative approach to meet the increasing power demands of energy storage systems in general. It is recognized that combining photovoltaic devices with energy charge storage devices enables applications in off-grid and low light situations and such devices are deemed essential for wide spread adoption of photovoltaic devices.

There are considerable efforts in developing photovoltaic-battery module by coupling on top of each other or side-by-side a thin film solar cell and a lithium-polymer battery. Such constructions require electrical interconnections which increase the internal mechanical resistance of the constructions and are typically not suitable for applications that need flexible substrates.

Thus, there is a need for improved integrated devices which allow energy conversion as well as energy storage.

SUMMARY OF THE INVENTION

In a first aspect, the present invention is directed to a hybrid device comprising:
  an energy converting unit comprising a first electrode, a second electrode and an energy converting medium arranged between the first electrode and the second electrode, wherein the energy conversion takes place between the first electrode and the second electrode;
  an energy charge storing unit comprising a first electrode, a second electrode and an electrolyte medium; wherein the energy charge is stored between the first and the second electrode,
  the second electrode of the energy converting unit and the second electrode of the energy charge storing unit being a shared electrode electrically connecting the energy converting unit and the energy charge storing unit; and wherein
  the shared electrode comprises a metal and a nanostructured material.

In another aspect, the present invention is directed to a method of manufacturing a hybrid device comprising a layered structure of a first component, a second component and a third component, comprising:
  forming the first component which comprises either
    depositing an energy converting unit, wherein the energy converting unit comprises an energy converting medium layer arranged on a first electrode layer, or
    depositing an energy charge storing unit, wherein the energy charge storing unit comprises an electrolyte medium layer arranged on a first electrode layer,
  forming the second component which comprises depositing a second electrode layer being a shared electrode on the energy converting medium layer or the electrolyte medium layer;
    wherein the second electrode layer comprises a metal and a nanostructured material;
  forming the third component which comprises either
    depositing an energy converting medium layer on the second electrode layer and depositing a further electrode layer on the energy converting medium layer if the first component is a energy charge storing unit; or
    depositing an electrolyte layer on the second electrode layer and depositing a further electrode layer on the electrolyte layer if the first component is an energy converting unit.

BRIEF DESCRIPTION OF THE DRAWINGS

The invention will be better understood with reference to the detailed description when considered in conjunction with the non-limiting examples and the accompanying drawings, in which:

FIG. 2 shows a setup of a hybrid device comprising two energy converting units connected in series, wherein the first energy converting unit and an energy charge storing unit have the shared electrode 30. The second energy converting unit which is not connected to the shared electrode 30 comprises a first electrode 25, a second electrode 26 and an energy converting medium layer 22 arranged between the two electrodes 25, 26. The second electrode 26 of the second energy converting units is not a shared electrode. In contrast, the second electrode of the first energy converting unit is a shared electrode with the energy charge storing unit. The second electrode 26 of the second energy converting unit is electrically connected with the first electrode 25 of the first energy converting unit using a metal paste 500. Silver paste, or a layer of solder, may be used for the metal paste 500.

FIGS. 4(A), 4(B), 4(C) and 4(D) show different embodiments with different structures of the shared electrode 30. In FIG. 4(A) the shared electrode 30 is comprised of a metal layer 34 and a layer comprised of a nanostructured material 32 which are stacked upon each other. The metal layer 34 is in direct contact with the energy converting medium layer 22 of the energy converting unit while the nanostructured material layer 32 is in direct contact with the electrolyte medium layer 15 of the energy charge storing unit 10. In FIG. 4(B), the shared electrode 30 comprises a physical mixture of metal particles and a nanostructured material 36. In FIG. 4(C), the shared electrode 30 comprises a nanostructured material which has metal nanoparticles bound at its surface 38. In one embodiment the metal nanoparticles are bound at the surface of the nanostructured material via a linker group. In FIG. 4(D), the shared electrode 30 comprises a layer of a nanostructured material 42 and a layer 44 of either a physical mixture of metal particles and a nanostructured material (44') or a nanostructured material which has metal nanoparticles bound at its surface (44").

FIG. 8 also shows an I-V curve of a single OPV for comparison.

FIG. 13 further illustrates the current flow within this hybrid device. The arrows at the left side indicate light. In this embodiment, the energy charge storing unit, i.e. in this case a supercapacitor (SC), is arranged between the energy converting units, i.e. in this case two OPVs.

FIG. 16(a) shows a schematic representation of the experimental cell assembly of a supercapacitor using silver decorated carbon nanotubes for the second electrode material and carbon nanotubes as the first electrode (CNT/Ag-CNT network). FIG. 16b shows CNTs decorated with Ag nanoparticles (Ag-CNT) having a diameter about 13 nm (scale bar 100 nm); FIG. 16c shows Ag-CNT with Ag nanoparticle diameter of about 4 nm (scale bar 100 nm). FIG. 16d shows a high resolution TEM image of 4 nm Ag-CNT (scale bar 5 nm) while FIG. 16e shows cyclic voltammograms for CNT supercapacitors with 13 nm Ag-CNT electrodes, 7 nm Ag-CNT electrodes, 4 nm Ag-CNT electrodes, 1 nm Ag-CNT electrodes and 2% Ag mixed with CNT (Ag+CNT) electrodes. FIG. 16f shows the galvanostatic charge-discharge curves for the corresponding supercapacitors.

FIG. 23(a) shows Nyquist impedance plots. The inset in FIG. 23(a) shows the high frequency, low impedance region. (b) Equivalent circuit model for CNT, 13 nm Ag-CNT, 7 nm Ag-CNT and 2% Ag-CNT devices. (c) Equivalent circuit model for 4 nm Ag-CNT and 1 nm Ag-CNT devices.

FIG. 24 shows the setup of a hybrid device in which the energy converting unit is a fuel cell (FC) and the energy charge storing unit is a supercapacitor (SC).

DETAILED DESCRIPTION OF THE PRESENT INVENTION

In a first aspect the present invention refers to a hybrid device. In a first embodiment the hybrid device comprises:
- an energy converting unit comprising a first electrode, a second electrode and an energy converting medium arranged between the first electrode and the second electrode, wherein the energy conversion takes place between the first electrode and the second electrode;
- an energy charge storing unit comprising a first electrode, a second electrode and an electrolyte medium; wherein the energy charge is stored between the first and the second electrode,
- the second electrode of the energy converting unit and the second electrode of the energy charge storing unit being a shared electrode (directly) electrically connecting the energy converting unit and the energy charge storing unit; and wherein
- the shared electrode is comprising a metal and a nanostructured material.

Figure 1:
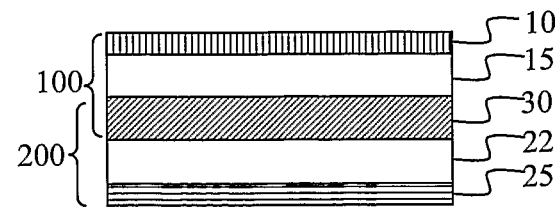
FIG. 1 shows a schematic setup of a hybrid device described herein. The hybrid device of FIG. 1 comprises an energy charge storing unit 100, such as a battery or supercapacitor, which has a shared electrode 30 in common with an energy converting unit 200, such as a photovoltaic cell or a fuel cell. The shared electrode 30 is comprised of a metal and a nanostructured material. The energy charge storing unit 100 comprises a layered structure of a first electrode 10 arranged on an electrolyte medium layer 15. The electrolyte medium layer 15 is in direct contact with the shared electrode 30 which thus forms the second electrode of the energy charge storing unit 100. The shared electrode is on one side in direct contact with the electrolyte medium layer 15 and on the other side with the energy converting medium layer 22 of the energy converting unit 200. Thus the shared electrode 30 also forms the second electrode of the energy converting unit 200. The energy converting medium layer 22 is arranged on the first electrode 25 of the energy converting unit 200.

The above hybrid device connects via the shared electrode an energy converting unit and an energy storing unit directly without the need for a wired connection between the two units or in other words without the need of electrical interconnections between both units for operation. FIG. 1 illustrates the general setup of such a hybrid device, wherein the shared electrode 30 is deposited between the energy converting unit and the energy charge storing unit thus forming a layered structure in which the shared electrode 30 takes over the function of an electrode of the energy charge storing unit as well as the energy converting unit. Usage of a shared electrode 30 can reduce the internal resistance between both units.

An energy charge storing unit is a unit which is adapted to store energy generated by the energy converting unit. As shown for example in FIGS. 1, 2 and 3, an energy charge storing unit comprises a first electrode 10 and an electrolyte medium 15. The second electrode of the energy charge storing unit is the shared electrode 30.

Figure 2:
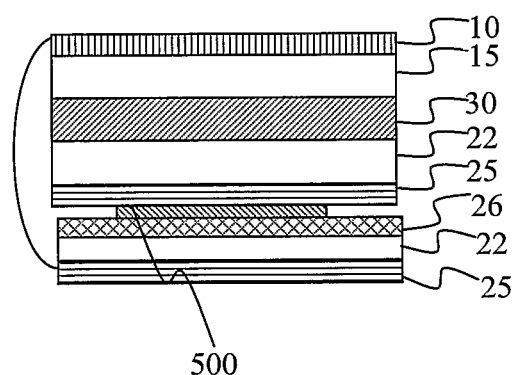
FIG. 2 shows a schematic setup of a hybrid device of another embodiment in which the hybrid device comprises more than one energy converting unit, wherein the energy converting units are connected with the energy charge storing unit in series.
Figure 3:
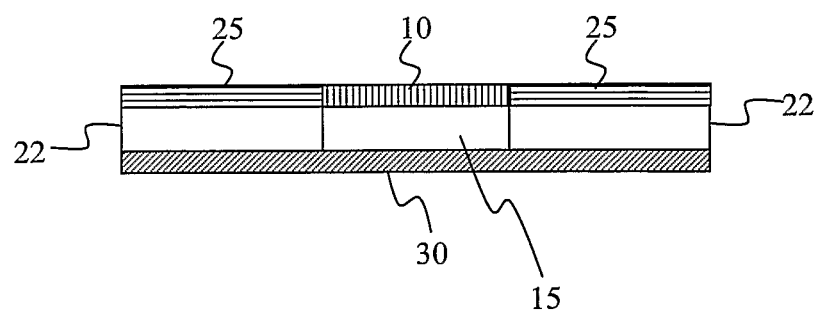
FIG. 3 shows a schematic setup of a hybrid device of another embodiment in which the hybrid device comprises more than one energy converting unit, wherein the energy converting units are connected with the energy charge storing unit in parallel.

The energy converting unit converts any form of energy into electrical energy. For example, the energy converting unit can convert thermal energy, radiation energy, or energy in form of pressure, acceleration, strain or force into electrical energy. As shown in FIGS. 1, 2 and 3 the energy converting unit 200 comprises a first electrode 25 and an energy converting medium 22. The second electrode of the energy converting unit 200 is the same electrode also used by the energy charge storing unit 100, namely the shared electrode 30.

The energy converting unit 200 and the energy charge storing unit 100 can be any known energy converting unit 200 and energy charge storing unit 100, respectively.

Examples of energy converting units include, but are not limited to a fuel cell, a photovoltaic cell, a thermoelectric converter and a piezoelectric converter.

For example, a fuel cell is an electrochemical device that converts the chemical energy of a fuel (hydrogen, natural gas, methanol, gasoline, etc.) and an oxidant (air or oxygen) into electricity. A fuel cell comprises a first and second electrode, namely a positively charged anode and a negatively charged cathode. The fuel cell also comprises an ion-conducting material, i.e. an energy converting medium. In other words, fuel cell construction generally consists of a fuel electrode (anode) and an oxidant electrode (cathode) separated by an ion-conducting material (energy converting medium), such as an ion-conducting membrane (such as a Nafion® membrane). Oxygen passes over one electrode, and hydrogen over the other, generating electricity, water and heat.

In more detail, in general, in a fuel cell a proton conducting solid membrane (PEM) is surrounded by two layers, a diffusion and a reaction layer. Under constant supply of hydrogen and oxygen the hydrogen diffuses through the anode and the diffusion layer up to the catalyst (normally a noble metal catalyst), the reaction layer. The reason for the diffusion current is the tendency of hydrogen oxygen reaction. Two main electrochemical reactions occur in the fuel cell. One reaction occurs at the anode (anodic reaction) and the other at the cathode. At the anode, the reaction releases hydrogen ions and electrons whose transport is crucial to energy production. The hydrogen ion on its way to the cathode passes through the PEM while the only possible way for the electrons is through an outer circuit. The hydrogen ions together with the electrons of the outer electric circuit and the oxygen which has diffused through the porous cathode reacts to water. The water resulting from this reaction can be extracted from the system by the excess air flow. This process occurs in all types of fuel cells, such as polymer exchange membrane fuel cell (PEMFC), solid oxide fuel cell (SOFC), alkaline fuel cell (AFC), molten-carbonate fuel cell (MCFC), phosphoric-acid fuel cell (PAFC) or direct-methanol fuel cell (DMFC), which can all be used as energy converting unit for the hybrid device described herein.

An illustrative example for a hybrid device which uses a fuel cell as energy converting unit is illustrated in FIG. 24. The setup of a hybrid device including a fuel cell as energy converting unit comprises a CNT network which forms the first electrode of the energy charge storing unit. An electrolyte layer (electrolyte medium layer) is deposited on top of the first electrode. The electrolyte layer is followed by a metal decorated CNT network (shared electrode) which forms the second electrode of the energy charge storing unit, i.e. in this case the supercapacitor (SC), and the energy converting unit, i.e. in this case the fuel cell (FC). The shared electrode layer is followed by the electrolyte layer or polymer membrane layer (energy converting medium layer) which is deposited on the shared electrode. The electrolyte/polymer membrane layer is followed by a metal decorated CNT network which forms the first electrode of the energy converting unit and is electrically connected with the CNT network of the energy charge storing unit (indicated by the black line in FIG. 24). Further illustrated in FIG. 24 is the flow of the reactants ($H_2$ and $O_2$) through the shared electrode and the first electrode of the fuel cell, respectively.

A piezoelectric converter comprises a first and a second electrode wherein between these electrodes a piezoelectric material (energy converting medium) is arranged which can produce electrical charges upon deformation. Piezoelectric materials are materials with polar axis but without a symmetrical center. Examples for such materials include α-quartz crystals, liquid crystals and certain polymers, such as polyvinylfluoride ($PVF_2$). The piezoelectric effect can be explained with a displacement of positive and negative charges upon exposure to an external force, such as pressure whereby an electric dipole moment is generated. Thus an external force, such as pressure can move charges in such a manner that an electric polarization, i.e. an electrical field, is generated.

A thermoelectric converter comprises a first and a second electrode wherein between these electrodes a thermoelectric material (energy converting medium) is arranged which can produce electrical charges upon generation of a temperature difference between the two sides of the thermoelectric material arranged between the two electrodes. Thermoelectric materials have the property that when a temperature difference is generated within the material, electrons flow to the cooler side of the thermoelectric material. Examples for such a thermoelectric material include, but are not limited to bismuth-stibium-telluride, thallium or natrium doped altait (an alloy of lead and tellurium) or nanoparticles made of a thermoelectric material, such as bismuth-stibium-telluride, which are pressed together.

A photovoltaic cell converts light, i.e. radiation having in general a wavelength of between about 380 to 750 nm, directly into electricity via the photovoltaic effect. Solar cells are one example of photovoltaic cells which use a specific light source for the manufacture of electricity, namely light from the sun. In a photovoltaic cell an electrical potential difference is generated between two electrodes when light hits a semiconductor material (energy converting medium) arranged between the two electrodes. The basic function of a photovoltaic cell is based on the photovoltaic effect which means that upon absorption of light by the semiconductor material an electron-hole-pair. The electron-hole-pair is generated which is separated in the built-in field of a p-n-junction which inhibits recombination of the generated electron-hole-pair.

Examples of photovoltaic cells include, but are not limited to a thin film photovoltaic cell (TFSC, also called thin film photovoltaic cell (TFPV)) or a silica based photovoltaic cell.

There are four main types of silica based photovoltaic cells, which are distinguished by the type of crystal used in them. The silica based photovoltaic cells comprise either monocrystalline, multicrystalline, polycrystalline, or amorphous silica as semiconductor layer which is arranged between the first and second electrode of the photovoltaic cell.

On the other hand, thin film photovoltaic cells use layers of semiconductor materials only a few micrometers thick. Thin film photovoltaic cells are usually categorized according to the photovoltaic material used. Common material categories include, but are not limited to cadmium telluride (CdTe), copper indium gallium selenide (CIS or CIGS), dye-sensitized photovoltaic cell (DSC), organic photovoltaic cell or thin-film silicon (TF-Si).

A thin-film photovoltaic cell using organic semiconducting materials comprises in general a first (anode) and second (cathode) electrode, wherein between those electrodes an organic material is arranged as junction (energy converting medium).

Three types of junctions (energy converting medium) are known for organic photovoltaic cells, namely single layer organic photovoltaic cells, multilayer organic photovoltaic cells and dispersed heterojunction photovoltaic cells. Single layer organic photovoltaic cells represent the earliest type of OPVs in which a single organic layer is sandwiched between two electrodes. Those single layer OPVs used crystals of highly conjugated, polycyclic molecules, such as anthracene crystal, phthalocyanine or porphyrins. A structure of some OPVs using a single layer of a semiconducting material include, but are not limited to Ag/merocyanine/Al and Au/ZnPC(phthalocyanine)/Al.

In general, the material first mentioned when referring to the composition of photovoltaic devices (in bold, e.g. Ag/merocyanine/Al) refers to the anode (e.g. Ag, ITO or Au), while the material last mentioned (in bold e.g. Ag/merocyanine/Al) refers to the cathode. Common electrode materials for a photovoltaic cell irrespective of the kind of photovoltaic cell are metals, such as Al, Au, indium tin oxide (ITO) or Ag. In general, at least one electrode is made of a transparent material, such as ITO.

Multilayer OPVs generally consist of an (electron) donor and an (electron) acceptor. Unlike silicon based photovoltaic cells, the donor and acceptor in an OPV are different materials and therefore those cells are also called heterojunction cells. Examples for OPVs using a heterojunction include, but are not limited to ITO(indium tin oxide)/CuPc/PTCBI(3,4,9,10-perylene tetracarboxylic bis(benzimidazole))/Ag, ITO/CuPc/PTCDA(3,4,9,10-perylentetracarboxyaciddianhydride)/In, ITO/DM-PTCDI(N,N'-dimethylperylene-3,4,9,10-bis(dicarboximide))/$H_2$Pc/Au, ITO/DM-PTCDI/$H_2$Pc/Au, ITO/PTCBI/$H_2$Pc/Au, ITO/PTCBI/DM-PTCDI/$H_2$Pc/Au, ITO/DM-PTCDI/CuPc/Au, or ITO/CuPc/PTCBI/BCP/Ag.

In a multilayer OPV comprising a donor and acceptor each material has a characteristic HOMO (highest occupied molecular orbital) and LUMO (lowest unoccupied molecular orbital) energy, with the HOMO and LUMO of the donor being higher in energy than their respective counterparts in the acceptor. The gap between the HOMOs and LUMOs is referred to as the optical band-gap. This optical band-gap determines the minimum wavelength of light required for excitation in each material. Photons hitting either donor or acceptor molecules excite an electron from the HOMO to the LUMO, but this does not generate a free electron-hole pair; rather, it creates a tightly coupled electron-hole pair called an exciton. This is due to the optical band-gap being smaller than the energy required to generate a free electron-hole pair. In order to generate the free electron-hole pair, the exciton must travel to the interface between the donor and acceptor molecules or between the organic molecules and the electrode. At these junctions, electrons, which have been excited to the LUMO of the molecule, can jump into the LUMO of the acceptor, or holes in the HOMO can jump into the HOMO of the donor. This dissociation can occur only if the difference in energy between the HOMOs or LUMOs is greater than the binding energy of the exciton. These phase-separated free electrons and holes then migrate to their respective electrodes.

Thus, in one embodiment, the organic material comprises a donor and acceptor material. The organic donor comprises two sides wherein the first side is in contact with the anode and the second side is in contact with the acceptor material. The acceptor material also comprises two sides wherein the first side is in contact with the donor material and the second side is in contact with the cathode.

The semiconducting materials used for the donor and acceptor material can be polymeric materials or small molecules. Donor materials must satisfy several requirements in order to function efficiently. Absorption of visible or IR light is vital for the conversion of photons into excitons. After exciton formation, the donor material must allow for the movement of the exciton to a donor-acceptor interface and also possess a sufficient difference in HOMO to HOMO and LUMO to LUMO energy levels to allow for exciton dissociation. Once dissociation occurs, the hole must be stabilized as it moves back to the anode.

Donor materials are selected from polymers or small molecules. Donor materials which can be used include, but are not limited to PFB (poly(9,9'-dioctylfluorene-co-bis-N, N'-(4-butylphenyl)-bis-N,N'-phenyl-1,4-phenylenediamine)), TFB (poly(9,9-dioctylfluorene-co-N-(4-butylphenyl)diphenylamine)), MDMO-PPV (poly((2-methoxy-5-(2, 7-dimethyloctyloxy))-1,4-phenylenevinylene)), $H_2Pc$ (phthalocyanine) or P3HT (poly(3-hexylthiophene-2,5-diyl)). Each of these donor materials is highly conjugated and possesses electron-donating atoms such as oxygen, sulfur or nitrogen. The donating hetero atom can also be used as the site of attachment for long alkyl chains, which improve solubility of the donor material.

Acceptor materials must meet many of the same requirements as donor materials with regard to absorption profiles, proper HOMO and LUMO interactions, and solubility. The major difference is the requirement that the acceptor material stabilizes free electrons. Acceptor materials are selected from polymers and small molecules. Materials which can be used include, but are not limited to CN-MEH-PPV (poly-(2-methoxy-5-(2'-ethylhexyloxy)-1,4-(1-cyanovinylene)-phenylene)), F8BT (poly(9,9'-dioctylfluoreneco-benzothiadiazole)), R-Ptcdi (N,N'-dialkyl-perylene-3,4,9,10-dicarboximide), PCBM (1-(3-methoxycarbonyl)propyl-1-phenyl[6,6]$C_{61}$), or a $C_{60}$ fullerene functionalized by using a perylene derivative. Instead of $C_{60}$ fullerene it is also possible to use carbon nanotubes.

The third type of OPVs is dispersed heterojunction photovoltaic cells. In this type of OPV the above mentioned electron donor and electron acceptor are mixed together to form a blend. Having a mixture of donor and acceptor material in OPVs, charge separation is achieved due to a band offset at the interface, and charge collection is achieved because of the existence of a bi-continuous network along which electrons and holes can travel through the electron acceptor and the electron donor, respectively towards their respective contacts. That is, the electrons are energetically liable to move into the phase with greater electron affinity (acceptor), while the photo-induced holes are energetically liable to move into the material phase with smaller ionization potential (donor). For instance, a heterojunction photovoltaic cell can use CN-PPV blended with MEH-PPV, such as in ITO/MEH-PPV/Ca. Other examples include, but are not limited to ITO/PEDOT:PSS/P3HT:PCBM/Ag, ITO/[DM-PTCDI/$H_2Pc]_2$/Au, ITO/PEDOT-PSS/[CuPc/PTCBI]$_2$/Ag$^h$], ITO/PEDOT(poly(3,4-ethylenedioxythiophene): PSS(poly(styrensulfonat))/[CuPc/PTCBI]$_3$/Ag$^h$], ITO/PPV/$C_{60}$/Al, ITO/PEDOT:PSS/MDMO-PPV(poly[2-methoxy,5-(3',7'-dimethyl-octyloxy)]-p-phenylene-vinylene)/PCBM/Al, ITO/MEH-PPV:PCBM/Ca$^d$, Au/PEDOT:PSS/MDMO-PPV:PCBM/LiF/Al$^d$, or ITO/MDMO-PPV:BCBM/Al$^d$.

Thus, the energy converting medium can be defined as the medium which in connection with the electrodes allows the energy converting unit to transform one form of energy into electrical energy. In case of a fuel cell the energy converting medium is the proton conducting solid membrane which is important to ensure separation of hydrogen ions and electrons without which no electrical energy could be generated. In a photovoltaic cell the energy converting medium is the layer or layers of semiconductor material which convert the radiation energy into electrical energy. In a thermoelectric converter the energy converting medium is the thermoelectric material which generates electrical charges upon generation of a temperature difference between the two sides of the thermoelectric material. In a piezoelectric converter the energy converting medium is the piezoelectric material which generates electrical charges upon deformation.

The energy charge storing units of the hybrid device described herein can include, but are not limited to a rechargeable battery, a supercapacitor or a hybrid electrochemical capacitor (HEC).

A rechargeable battery comprises a first and a second electrode between which an electrolyte (electrolyte medium) is arranged. The electrolyte can be a liquid electrolyte or a gel-like polyelectrolyte. Examples for rechargeable batteries include mercury, nickel-cadmium, nickel-iron, nickel-hydrogen, nickel-metal hydride, nickel-zinc, lithium-ion, lithium-manganese, lithium-polymer, lithium-iron-phosphate, lithium-sulfur, lithium-titanate, or silver-zinc battery, to name only a few examples.

A hybrid electrochemical capacitor (HEC) is an electrochemical energy storage device where one electrode is from a battery (typically Li-ion battery) and the other from a supercapacitor.

Electrochemical capacitors (ECs) often called as "supercapacitors" are electrical devices with highly reversible charge storage and delivery capabilities. Whereas a regular capacitor consists of conductive foils and a dry separator, the supercapacitor crosses into battery technology by using special electrodes and an electrolyte (electrolyte medium). Electrochemical capacitors differ from batteries in that they do not store energy in redox reactions that occur in the electrode structure. Electrochemical capacitors store energy through electrostatic interactions that occur in the electrode and electrolyte interface region, also known as the double layer. ECs have properties complementary to secondary batteries and are composed, e.g., of carbon based electrodes and an electrolyte. ECs and other energy charge storage devices, such as batteries, can employ both aqueous and non-aqueous electrolytes in either liquid or solid state.

The shared electrode in the hybrid device described herein comprises a metal and a nanostructured material. Any metal that can be used as electrode material can also be used as electrode material for the shared electrode. In one embodiment the metal includes, but is not limited to a noble metal, a metal oxide, a metal alloy, an intermetallic, or mixtures of the aforementioned metals.

The group of noble metals includes silver, palladium, gold, platinum, mixtures or alloys thereof. In one embodiment, silver, gold or platinum can be used.

In another embodiment metal oxides can be used. A metal oxide can include, but is not limited to $PtO_2$, $V_2O_3$, $V_2O_5$, $Nb_2O_5$, $NiO_2.xH_2O$, $LiCoO_2$, $LiFeO_2$, $LiMn_2O_3$, $Li_2MoO_4$, $Li_2TiO_3$, $MnO_2$, $Ag-MnO_2$, $Al_2O_3$, $MoO_3$, $TiO_2$, $SiO_2$, $ZnO_2$, $SnO_2$, $Fe_2O_3$, $NiO$, $Co_3O_4$, $CoO$, $Nb_2O_5$, $W_2O_3$ and mixtures thereof.

The metal which forms part of the shared electrode can also include an alloy. Alloys can include but are not limited to alloys which are made of elements selected from the group of elements of group 10, 11, 12, 13, 14 and 16 of the periodic system (IUPAC nomenclature recommendation of 2006 according to Fluck and Heumann, periodic system 2007 Wiley-VCH GmbH & Co. KGaA, Weinheim, 4th edition). Group 10 includes nickel (Ni), palladium (Pd) and platinum (Pt); group 11 includes copper (Cu), silver (Ag) and gold (Au); group 12 includes zinc (Zn), cadmium (Cd) and mercury (Hg); group 13 includes boron (B), aluminium (Al), gallium (Ga), indium (In) and thallium (Tl); group 14 includes carbon (C), silicon (Si), germanium (Ge), tin (Sn) and lead (Pb); and group 16 includes oxygen (O), sulfur (S), selenium (Se), tellurium (Te) and polonium (Po).

In one embodiment, the alloy is made of elements including, but not limited to lithium/aluminium, Au, Pt, Pd, Cu, In, InSe, CuSe and $SnS_2$.

In another embodiment, the metal used in the shared electrode is an intermetallic. An intermetallic is a composition which consists only of metal atoms which are bound to each other via metallic bonds in non-stoichiometric ratios. Examples of such intermetallics include Ag-Ni or Ag-Au.

Nanostructured materials as they can be used in the shared electrode described herein are characterized by a large surface area which can be at least about 50 $m^2/g$. In one embodiment the surface area of the nanostructured material is about 100, or 200 or 300 $m^2/g$. Another factor that can contribute to the surface of the nanostructured material is its porosity. Thus, in one embodiment the nanostructured material to which those metal nanoparticles are bound can comprise pores having a maximal dimension of between about 2 nm to about 5 μm. In another embodiment a mesoporous nanostructured material is used, i.e. pores with a maximal dimension of between 2 to 50 nm. In still another embodiment, a macroporous nanostructured material is used, i.e. pores with a maximal dimension of between or >50 nm to about 5 μm.

Nanostructured material refers to a material with dimensions in the nanometer range. In one embodiment, at least one dimension of the nanostructured material is less than 100 nm. In another embodiment, a nanostructured material has a dimension typically ranging from 1 to 100 nm (where 10 angstrom=1 nm=1/1000 micrometer). Nanostructured materials can be classified into the following dimensional types:

Zero dimensional (0D): nanospherical particles. (also called nanoparticles);
One dimensional (1D): nanorods, nanowires (also called nanofibers) and nanotubes; and
Two dimensional (2D): nanoflakes, nanodiscs and nanofilms.

Thus, in one embodiment, the nanostructured material can include, but is not limited to nanotubes, nanowires, nanoflakes, nanoparticles, nanodiscs, nanofilms or combinations of the aforementioned nanostructured materials in a mixture (e.g. a mixture of nanotubes and nanowires). The nanotubes can be single-walled (SWNT) or double-walled (DWNT) or multi-wall nanotubes (MWNT). A single-wall nanotube can be defined by a cylindrical sheet with a diameter of about 0.7 to about 10 or 20 nm or with a diameter of <2 nm. They can be several micrometer long, i.e. at least 1 μm or at least 2 μm or between about 1 μm and 5 μm. Double-wall or multi-wall nanotubes consist of numerous cylinders tightly stuck into another.

In one embodiment the nanotubes are made of carbon and can be used as single-wall carbon nanotubes (SWCNT), double-wall carbon nanotubes (DWCNT) or multi-wall carbon nanotubes (MWCNT). Single-wall carbon nanotubes can be described as a graphite plane (so called graphene) sheet rolled into a hollow cylindrical shape so that the structure is one-dimensional with axial symmetry, and in general exhibiting a spiral conformation, called chirality.

For example, the use of carbon nanotubes as electrode material can provide a high electrical conductivity of at least or about 2000 S/cm, which is important for electron transport from the energy converting unit to the energy charge storing unit or vice versa. In addition, thin layers of carbon nanotubes can be formed as transparent electrode and thus provide transparency in visible and infrared wavelength range. At the same time layers of carbon nanotubes provide good mechanical and thermal properties and can be manufactured to be flexible. Carbon nanotubes are also solution processable and are thus compatible with printing techniques for fabrication.

Besides carbon the nanostructured material can also be made of another material which includes, but is not limited to ceramic, glass, aluminium oxynitride, a polypyrrole and mixtures nanostructured materials made of different of the aforementioned materials. Examples for ceramic materials that can be used include, but are not limited to transition metal oxides, $TiO_2$, $SnO_2$ or metal sulfides, such as $SnS_2$.

Figure 4:
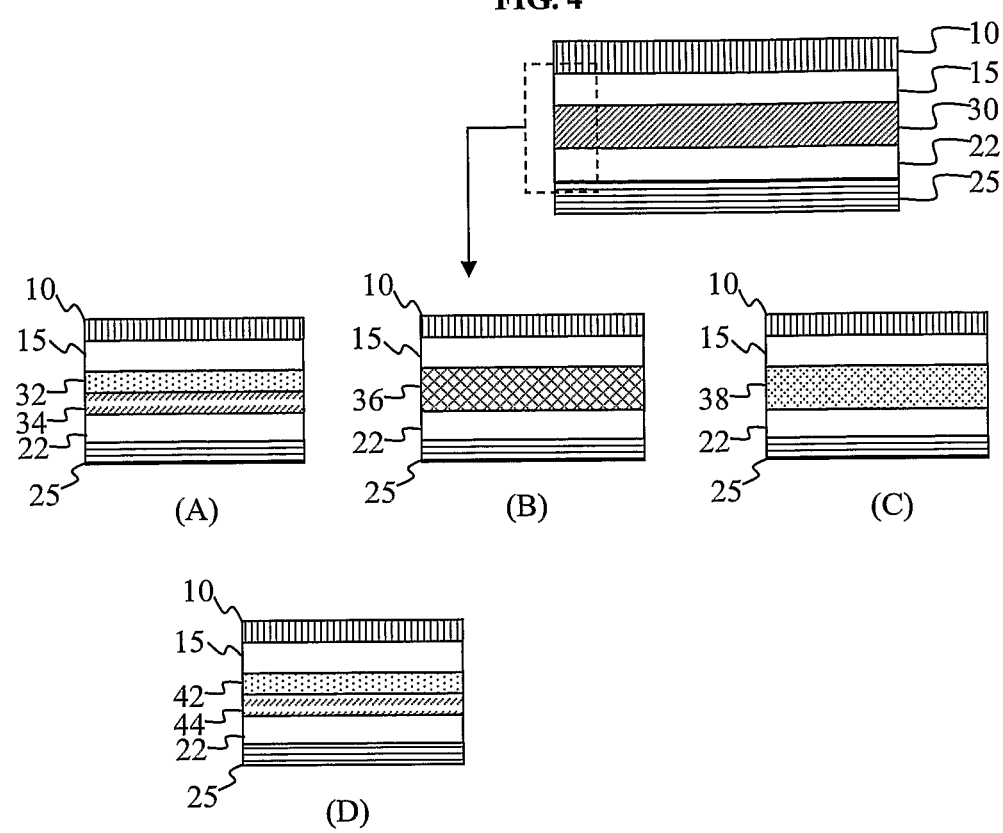
FIG. 4 shows an enlarged view of a section of the hybrid device to illustrate different embodiments of the hybrid device described herein.

In one embodiment, the metal of the shared electrode is in form of a first layer (first metal layer) which is in direct contact with the energy converting medium of the energy converting unit and wherein the nanostructured material forms a second layer arranged on the first layer and wherein the second layer is in direct contact with the electrolyte medium of the energy charge storing unit. The first metal layer should not be too thin to ensure good sheet resistance and at the same time have a sufficient thickness to serve as barrier layer. Therefore, in one embodiment, the first metal layer has a thickness of at least 100 nm. In one embodiment an aluminium layer is used as first metal layer. An illustrative example of such a device is shown in FIG. 4(A) in which the first electrode 10 is arranged on the electrolyte medium 15 of the energy charge storing unit. The electrolyte medium layer 15 is deposited on the layer of nanostructured material 32. The layer of nanostructured material 32 is deposited on the metal layer 34. The layer of nanostructure material 32 and the metal layer 34 form together the shared electrode 30. The shared electrode takes the position of the second electrodes of the energy converting unit and the energy charge storing unit.

In another embodiment, the metal layer is formed of metal particles rather than a uniform layer of metal. Those particles can be spherical. The metal particles can be metal microparticles or metal nanoparticles, i.e. having a maximal dimension in the micrometer range and the nanometer range, respectively. In one embodiment, the metal particles which can be used in the hybrid device described herein have a maximal dimension of between about 1 nm to about 2 or 3.5 μm. Metal nanoparticles can have a maximal dimension of below 100 nm, or below 50 nm, or below 20 nm, or between about 1 nm to about 40 nm, or about 1 nm to about 20 nm, or about 1 nm to about 10 nm, or about 1 nm to about 5 nm, or about 2 nm to about 20 nm or a maximal dimension of at least 1, 2, 3 or 4 nm. In case those particles are perfectly spherical, the maximal dimension is equal to the diameter of the particles.

In one embodiment the particle size distribution of nanoparticles within a given population of nanoparticles used in the hybrid device can vary. For example, the particle size distribution of nanoparticles with a size of between about ≥12 nm to 20 nm can be about ±5 nm; the particle size distribution of nanoparticles with a size of between about ≥5 nm to <12 nm can be about ±3 nm; and the particle size distribution of particles with a size of between about 2 nm to <5 nm can be about ±1 nm.

In another embodiment, the metal particles can be mixed with the nanostructured material or they can be chemically bound to the surface of the nanostructured material. In a mixture of a nanostructured material and metal particles, the metal particles can be comprised in a range of between about 2 wt % to about 20 wt % based on the total weight of the nanostructured material or between about 2 to 10 wt %, or between 5 to 20 wt %, or between 10 to 15 wt %. If the metal particles are mixed with the nanostructured material, the size range of the metal particles can be between about 2 μm to 3.5 μm but can also be in the nanometer with the dimensions as indicated above.

The metal particles can be chemically bound to the surface of the nanostructured material via a linker. A linker is a molecule connecting the surface of the nanostructured material with the metal particles. A linker can include a functional group such as a hydroxyl group, a pyrene, an ester, a thiol, an amine or a carboxyl group. It is also possible that mixtures of different linkers of the aforementioned group are used to bind particles to the surface of the nanostructured material. Examples of suitable linkers can include, but are not limited to porphyrine (including amine groups) or polyethylene glycol (PEG; also known as poly (ethylene oxide)) (including —OH groups).

In one embodiment, the carboxyl group can be comprised in a linker including, but not limited to formic acid, acetic acid, propionic acid, butanoic acid, pentanoic acid, hexanoic acid, cycloalkane carboxylic acids or benzoic acid. Furthermore, the hydroxyl group can be comprised in a linker including, but not limited to phosphoric acid or sulfonic acid. Using such linkers to connect the particles to the surface of the nanostructured material can enhance the device energy density while reducing the internal resistance. Further improvement can be obtained in case the metal particles are evenly distributed at the surface of the nanostructured material. Therefore, in one embodiment, the metal particles are evenly distributed at the surface of the nanostructured material. In one embodiment, between about 5% to about 80% of the surface of the nanostructured material is covered with the metal particles.

In one embodiment, the shared electrode can be transparent or translucent or opaque. A transparent material allows radiation, such as light, to pass through the material. The opposite property is opacity. Transparent materials are clear (i.e. they can be seen through). A translucent material allows only radiation of a specific wavelength or wavelength range to pass through it.

For example, in an embodiment in which the energy converting unit is a photovoltaic cell it would be necessary that light shines through the energy storing unit if the energy storing unit is arranged on the energy converting unit and the light falls onto the device from the side which the energy storing unit is facing. In such cases it is not only desirable that the shared electrode is transparent but also the other components of the energy charge storing unit. Therefore, in one embodiment, the energy charge storing unit is made of a transparent material. In some cases, it might be desirable that the material used only allows radiation of a specific wavelength to pass. In such cases, the shared electrode and the energy charge storing unit can be made of a translucent material.

The shared electrode can have a thickness of between about 10 nm to about 200 nm or between about 10 nm to about 100 nm, or between about 10 nm to about 50 nm or between about 20 nm to about 100 nm. In one embodiment, the shared electrode is at least 10, 20 or 30 nm thick. In a further embodiment, the overall thickness of the hybrid device is about 1 μm to about 10 mm. In case the hybrid device is arranged on a substrate supporting the device, the overall thickness can be higher which depends largely on the thickness of the substrate. A substrate can be any substrate suitable to support electric devices. A suitable substrate can include, but is not limited to a polymer/plastic or glass.

It is also possible to connect several energy converting units in series or in parallel. For example, in one embodiment, the hybrid device comprises at least two energy converting units, wherein the at least two energy converting units are connected to each other in series; wherein the first energy converting unit in the series comprises the shared electrode which is electrically connecting the first energy converting unit to the energy charge storing unit. An illustrative example of such a device is shown in FIG. 2. As can be seen in FIG. 2, the first electrode 10 of the energy charge storing unit of the hybrid device is electrically connected via a wire with the first electrode 25 of a second energy converting unit. The second energy converting unit does not have a shared electrode but is only electrically connected to the hybrid device having a shared electrode. The second energy converting unit shown in FIG. 2 comprises a second electrode 26. The second electrode 26 of the second energy converting unit is electrically connected with the first electrode 25 of the first energy converting unit using a metal paste 500, such as a silver paste, or a layer of solder. Although not shown, it would also be possible to use a wire. In one embodiment, the second electrode 26 is made of the same or a different material than the shared electrode. It is also possible to connect more than two energy converting units in series.

Figure 11:
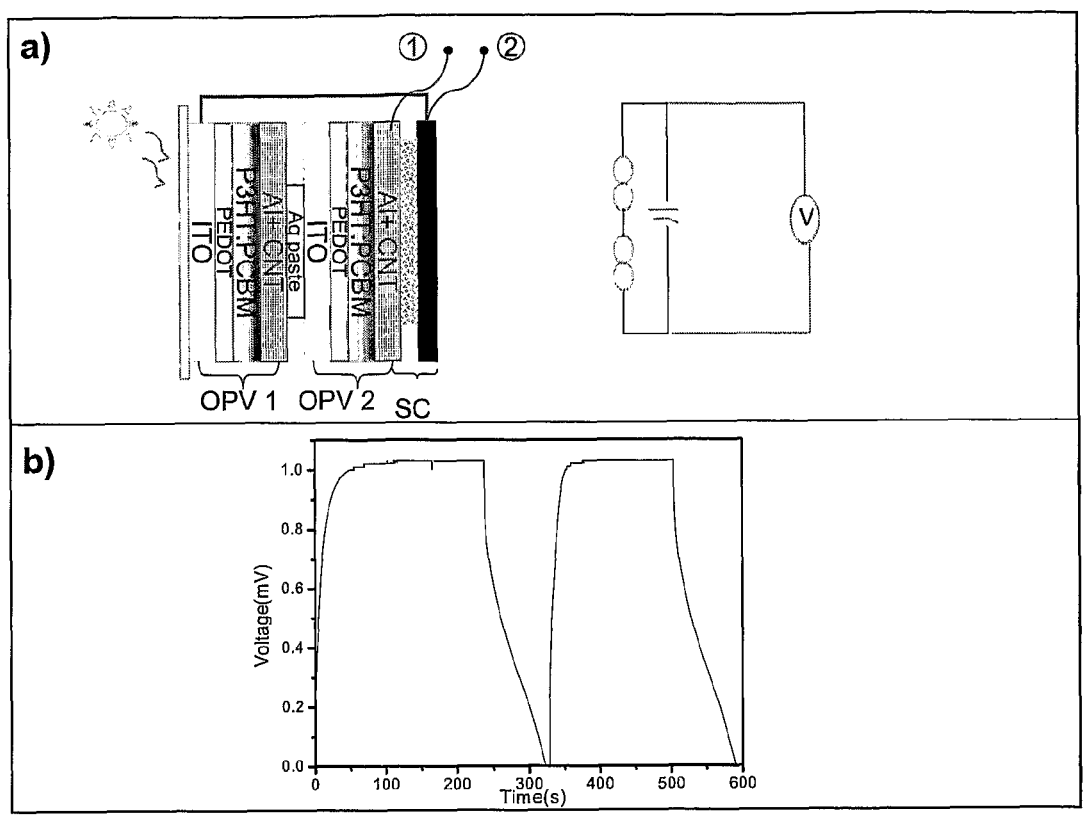
FIG. 11(a) shows a schematic illustration and a circuit illustration of a hybrid device showing the supercapacitor connected with two OPV connected in series during charging process.
FIG. 11(b) shows the charge and discharge curves of the hybrid devices shown in FIG. 11(a) which are plotted as a function of time.

FIG. 11 illustrates an example of a hybrid device in which two energy converting units are connected in series. As can be seen in FIG. 11, two organic photovoltaic cells (OPV1 and OPV2) are connected in series with a supercapacitor (SC). OPV2 comprises a shared electrode with the supercapacitor (SC) which is arranged on OPV2. OPV2 is provided in a layered structure in the following order ITO/PEDOT/P3HT:PCBM/Al+CNT(shared electrode). OPV1 consists of ITO/PEDOT/P3HT:PCBM/Al+CNT. SC is provided as a second electrode 1 (being a shared electrode with the Al+CNT layer of OPV2) and a first electrode 2. The ITO electrode of OPV1 is connected with the first electrode 2 of SC, while the Al+CNT electrode of OPV1 is connected with the ITO electrode of OPV2. The ITO electrode of OPV1 is also covered with a glass slide.

In a further embodiment the hybrid device comprises at least one energy charge storing and at least two energy converting units which are connected in parallel. FIG. 3 illustrates an example of a parallel connection of one energy charge storing unit and two energy converting units. For example, in such an embodiment

- the at least one energy charge storing unit is arranged between the at least two energy converting units;
- the shared electrode 30 is electrically connecting the electrolyte medium 15 and the energy converting medium 22 of the at least one energy charge storing unit and both of the at least two energy converting units respectively; and
- the first electrode 10 of the at least one energy charge storing unit is electrically connected to the first electrodes 25 of the energy converting units.

Figure 13:
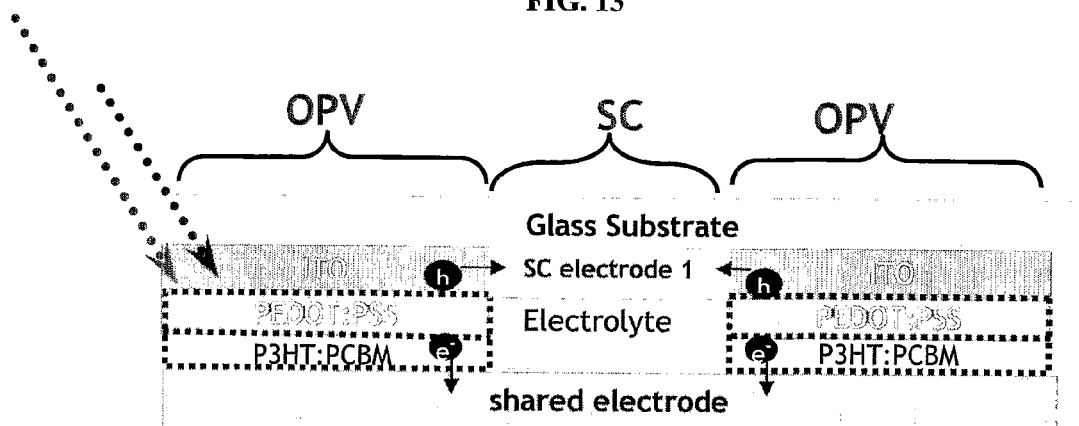
FIG. 13 shows the experimental setup of a hybrid device in which the charge storing unit is placed in parallel with two parallel connected OPVs.

FIG. 13 illustrates a hybrid device in which a supercapacitor is placed in parallel with two organic photovoltaic cells. The OPV is provided in a layered structure in the following order ITO/PEDOT:PSS/P3HT:PCBM/shared electrode. The first electrode 10 of the supercapacitor is connected to the first electrodes 25 of the OPVs which are made of indium tin oxide (ITO), a transparent electrode material. The shared electrode 30 is electrically connecting the electrolyte medium 15 of the supercapacitor and the energy converting medium 22 of the OPV. In this embodiment, the energy converting medium 22 of the OPV comprises a dispersed heterojunction of PEDOT:PSS and P3HT:PCBM. The whole device is covered on top with a glass slide extending over the first electrodes of the energy converting units and the energy charge storing unit. A configuration as illustrated in FIG. 13 can be useful in case such hybrid devices are used in a modular structure in which different hybrid devices ("tiles") as the one shown in FIG. 13 are assembled together in a module.

In another embodiment, illustrated in FIG. 4(D) the shared electrode (30) comprises a first layer 44 of a nanostructured material mixed (physical mixture) with metal particles (44') or a first layer 44 of metal particles or nanoparticles bound to the surface of the nanostructured material (with metal nanoparticle decorated nanostructured material) (44"). The second layer 42 of the shared electrode in this embodiment is made of a nanostructured material. Thus, the shared electrode is comprised of two layers arranged on each other. The first layer 44 of the nanostructured material mixed with the metal particles or the first layer of the metal particles bound to the surface of the nanostructured material is arranged on the energy converting medium 22, wherein the second layer 42 of the nanostructured material is arranged between the first layer and the electrolyte medium 15 of the energy charge storing unit. Depending on the energy converting unit and/or energy charge storing unit used, the order of layers can however also be reversed.

In a further aspect, the present invention refers to a method of manufacturing a hybrid device as described above. In one embodiment, a method of manufacturing a hybrid device comprising a layered structure of a first component, a second component and a third component can comprise:

forming the first component which comprises either
  depositing an energy converting unit, wherein the energy converting unit comprises an energy converting medium layer arranged on a first electrode layer, or
  depositing an energy charge storing unit, wherein the energy charge storing unit comprises an electrolyte medium layer arranged on a first electrode layer,
forming the second component which comprises depositing a second electrode layer being a shared electrode on the energy converting medium layer or the electrolyte medium layer;
  wherein the second electrode layer comprises a metal and a nanostructured material;
forming the third component which comprises either
  depositing an energy converting medium layer on the second electrode layer and depositing a further electrode layer on the energy converting medium layer if the first component is a energy charge storing unit; or
  depositing an electrolyte layer on the second electrode layer and depositing a further electrode layer on the electrolyte layer if the first component is an energy converting unit.

Thus, the above method allows forming a hybrid device beginning with the energy converting unit or the energy charge storing unit. The above layered structure can be manufactured using methods known in the art, such as filtering, casting, spin coating, roll-casting, spraying and inkjet printing.

Preferably, the hybrid device is printable which requires that the single layers of the hybrid device are sufficiently thin. For example, the overall thickness of a hybrid device including an OPV and a supercapacitor is between about 1 µm to about 10 mm or at least 1 µm or below 10 mm. The overall thickness of other hybrid devices including another kind of energy converting unit would be in the same range.

The thickness of the layers forming the energy converting medium can vary depending on its application. For example, in one embodiment, for a hybrid device as illustrate in FIG. 5c (left side), a PEDOT:PSS solution is spin coated onto the ITO coated glass substrate. The thickness of this PEDOT:PSS layer can be between about 30 to 60 nm. Subsequently, a 1:1 blend of P3HT and PCBM is spin coated onto the PEDOT:PSS layer. The thickness of this P3HT:PCBM layer can be between about 50 to 300 nm or between about 50 to 240 nm or between about 100 nm to about 300 nm or between about 100 to about 240 nm or at least 100 nm. In general, the thickness of an active layer in an OPV, i.e. the layer in which the charge separation takes place (such as a layer of PEDOT:PSS together with P3HT:PCBM), should be thick enough to prevent severe penetration of solution to form the nanostructured material but thin enough to ensure sufficient distance for charge generation in an OPV. Therefore, the active layer can have a thickness of between about 50 to 300 nm or about 100 to 300 nm.

Figure 5:
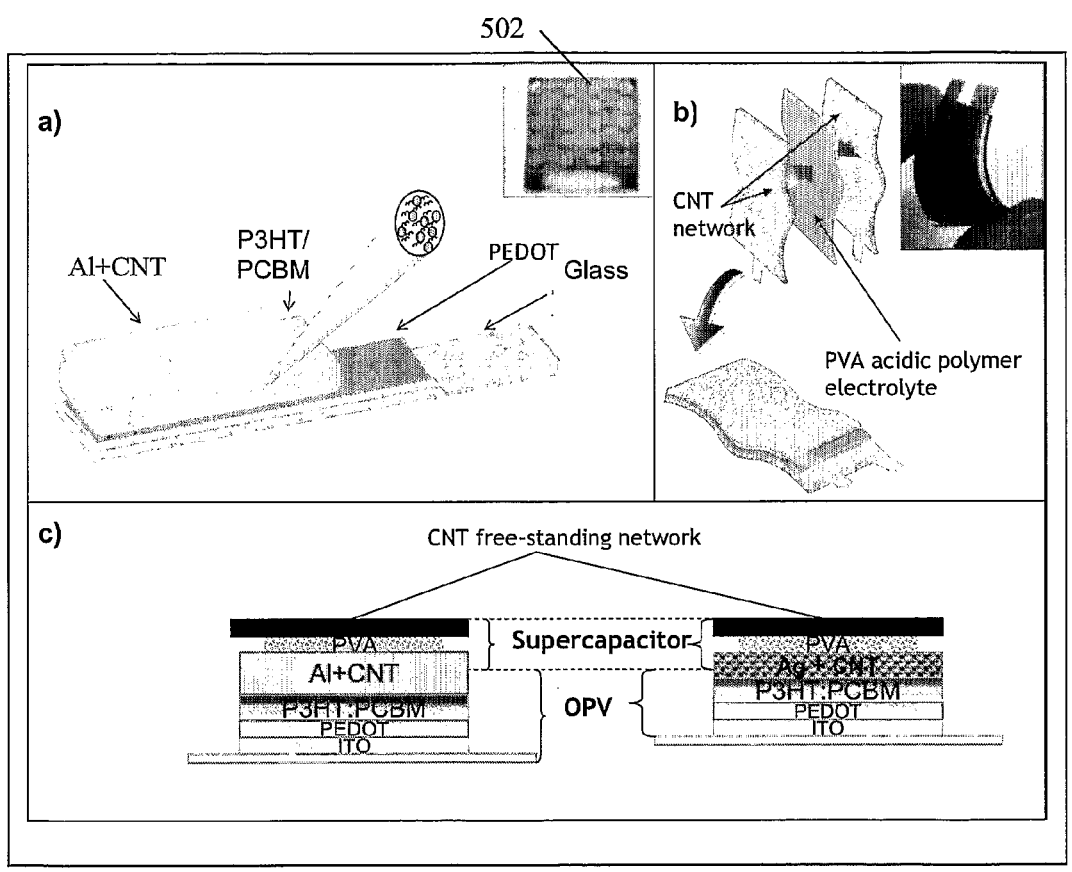
FIG. 5(a) shows a schematic representation of the assembly of organic photovoltaic (OPV) which serves as energy converting unit in one of the hybrid devices illustrated in FIG. 5(c), namely the embodiment of a hybrid device shown on the left of FIG. 5(c). The inset in FIG. 5(a) shows a photograph of the OPV. This photograph shows an example of an assembled device configuration in which ten devices 502 are arranged on a 1"×1" substrate. One end of each device 502 is the OPV electrode while the other end is an extension for clipping. The circular inset in FIG. 5(a) shows an enlarged view of the active layer of P3HT-PCBM of the OPV. The serrated line represents polymeric chains of P3HT while the circle represents PCBM ($C_{60}$ bucky ball structure) molecules.
FIG. 5(b) shows a schematic representation of the assembly of a supercapacitor (SC) which serves as energy charge storing unit in the hybrid device illustrated in FIG. 5(c). The inset in FIG. 5(b) shows a photograph of the supercapacitor.
FIG. 5(c) shows schematic representations of two different embodiments of a hybrid device. On the left of FIG. 5(c) shows a cross sectional view of a hybrid device comprising an OPV and a supercapacitor wherein the shared electrode (Al+CNT) comprises an aluminium (Al) layer arranged on a nanostructured layer comprised of carbon nanotubes. On the right of FIG. 5(c) shows a cross sectional view of a hybrid device comprising an OPV and a supercapacitor wherein the shared electrode comprises an Ag decorated carbon nanotube network, i.e. carbon nanotubes which have bound Ag nanoparticles at its surface.

The hybrid device illustrated in FIG. 5c (left side) also comprises a supercapacitor. The supercapacitor electrode material of the hybrid device illustrated in FIG. 5c is based on carbon nanotubes.

In general, carbon nanotubes can be manufactured using methods known in the art, such as electric arc discharge methods, laser vaporization methods, chemical vapor deposition methods or hydrothermal synthesis.

In one embodiment, for the preparation of a supercapacitor single walled carbon nanotubes with a COOH functionalized surface (linker molecules) are filtered to form a membrane which serves as the first electrode of the supercapacitor which forms part of the hybrid device shown in FIG. 5c (left side). Such an electrode layer of a supercapacitor can have a thickness of between about 20 µm to 100 µm. In one embodiment, poly(vinyl acetate) (PVA) is used as electrolyte medium of the supercapacitor which separates the first electrode from the second electrode. In another embodiment, other solid polymer electrolytes can be used, such as poly(urethane) or perfluorosulfonic acid. The polymer matrix can further include acids, such as $H_3PO_4$ (e.g. PVA matrix with $H_3PO_4$).

In the next step the shared electrode can be formed. The shared electrode can be formed in different ways depending on its composition. Different configurations of the shared electrode have been discussed above and are illustrated in FIG. 4. In one embodiment, the method of forming the shared electrode comprises:

depositing the metal as a metal layer on either the energy converting medium layer of the first component or the electrolyte medium layer of the first component; and
depositing the nanostructured material as a nanostructured material layer on the metal layer.

In the embodiment illustrated in FIG. 5c (left side), a metal layer, such as an Al layer is deposited onto the P3HT:PCBM layer of the OPV for example by using thermal evaporation. The thickness of such a metal layer can be at least 50 nm, or at least 100 nm, or between about 50 nm to about 300 nm, or between about 100 nm to about 300 nm. In a further step a solution of carbon nanotubes is drop casted onto the Al layer. The shared electrode thus comprises, in this embodiment, a metal layer and a carbon nanotube layer. Localized deposition of the nanostructured solution on top of the already deposited Al layer of the OPV is performed to prevent unnecessary shorting between the shared electrode and the anode of the OPV.

In general, the solution of a nanostructured material is of a concentration giving a viscosity that prevents the solution from penetrating through adjacent layers. A sample concentration of the nanostructured material is about 3 to 20 mg/ml.

Several of the above manufacturing steps are implemented to prevent electrical shorting between Al cathode and ITO anode in a hybrid device comprised of an OPV and a supercapacitor, which may occur during the deposition of nanostructured solution to fabricate the common electrodes. These manufacturing steps are: A) Selecting a thickness ranging from, e.g., 100 to 300 nm for the active layer. This can prevent severe penetration of solution to form the nanostructured material and ensures sufficient distance for charge generation in OPV. B) Selecting a thickness of at least 100 nm for the Al cathode. This thickness provides relatively good sheet resistance and at the same time serves as a barrier layer. C) Selecting a solution concentration range of 3 to 20 mg/ml for the nanostructured materials to give a viscosity that prevents the solution from penetrating through adjacent layers. D) In forming the shared electrode, performing localized deposition of the nanostructured solution on top of an Al layer deposited on the P3HT:PCBM layer of an OPV. Localized deposition of the nanostructured solution on top of the cathode of the OPV can prevent unnecessary shorting between the shared electrode and the anode of the OPV.

In a further step the previously prepared supercapacitor layers made of a CNT network layer and a PVA layer are stacked onto the drop casted metal layer thus forming the hybrid device as illustrated in FIG. 5c (left side).

In another embodiment, the shared electrode is formed in a method comprising:
  depositing a first layer of the nanostructured material which is either mixed with metal particles or wherein metal particles are chemically bound to the surface of the nanostructured material on either the energy converting medium layer of the first component or the electrolyte medium layer of the first component; and
  depositing a second layer of a nanostructured material on the first layer.

Manufacturing of a nanostructured metal or metal oxide decorated material, such as a carbon nanotube decorated, for example, with noble metal particles, metal oxide particles or mixtures thereof, can be carried out by a method comprising:
  mixing a porous nanostructured material with a solution comprising a particle precursor or a metal oxide particle to obtain a suspension of the nanostructured material with the solution comprising the particle precursor or the metal oxide particle;
  chemically reducing the particle precursor or the metal oxide particle to allow precipitation of the particles at the surface of the nanostructured material at a temperature of less than 60° C.

In one embodiment, the reaction conditions during the chemical reduction are chosen/adapted such as to form particles with a maximal width between about 1 nm to about 40 nm or between 1 to about 20 nm. The chemical reduction can be influenced by adjusting the concentration of metal precursor in the suspension.

Chemical reduction of the particle precursor or the metal oxide can be carried out using any of the following methods: adjusting the pH in the suspension to allow precipitation; or heating the suspension in a reducing atmosphere, such as heating in an 5% $H_2/N_2$ or 5% $H_2/Ar$ atmosphere at a temperature <500° C. for 4 to 8 hours; or using a chemical reducing agent, such as sodium borohydride ($NaBH_4$) or other metal hydrides, such as $CaH_2$ or $MgH_2$.

When adjusting the pH to allow precipitation, the pH can be chosen to be in a range of between about 1 to 7.5 or 4 to 7.5. For example, in case a silver precursor is used, the pH can be adjusted/adapted to be about 4.3<pH<7.3. In case a gold precursor is used, the pH can be adjusted/adapted to be about 4 to 12 and in case a platinum precursor is used, the pH can be adjusted/adapted to about 4 to 9. In another example, the pH can be adjusted/adapted to be about 1 to 7 in case a manganese precursor is used.

Suitable precursor materials can include, but are not limited to $AgNO_3$, $[Ag(NH_3)_2]^+$ (aq), $HAuCl_4.3H_2O$, $H_2PtCl_6.6H_2O$ and $H_2PdCl_6.6H_2O$, $Mn(NO_3)_2$, or $KMnO_4$. The concentration of the particle precursor in the solution of the particle precursor can be between about 3 mM to about 150 mM.

In one embodiment, the molar ratio of Ag metal precursor to nanostructured material in the solution can be between 0.18 to about 0.54.

For the formation of the nanostructured metal or metal oxide decorated material, the suspension of the nanostructured material with the solution comprising the particle precursor or the metal oxide particle can react for a time between about 15 min to about 120 min or between about 15 to about 60 min.

The temperature for carrying out the chemical reduction can be below 60° C. In one embodiment, the temperature is between about 15° C. to about 30° C. or between about 15° C. to 25° C. or is about 0° C., 5° C., 10° C., 15° C., 20° C., 25° C., 30° C., 35° C., 40° C., 45° C., 50° C. or 55° C.

The method of manufacturing allows controlling the size of the metal or metal oxide particles forming at the surface of the nanostructured material stopping said precipitation of said particle at the surface of said nanostructured material. Therefore, in one embodiment the method comprises stopping the growth of the metal or metal oxide particle when the size of the particle/microspheres is below 100 nm, or below 50 nm, or below 20 nm. In one embodiment, the reaction is stopped when the size of the particles is between about 1 to 50 nm, or between about 1 to 20 nm, or about 1 to 15 nm, or about 1 to 12, or about 1 to 5 nm. In another embodiment, precipitation is stopped if the size of the particles formed is about 1 nm or 2 nm or 3 nm or 4 nm or 5 nm.

The nanostructured material can include any of the nanostructured material already mentioned above. In one embodiment, the nanostructured material is dispersed in a first solution, such as an aqueous solution, before mixing it in the solution with the particle precursor or the metal oxide particle.

Besides dispersing the nanostructured material in a first solution, in one embodiment, the nanostructured material is treated before mixing it in the solution comprising the particle precursor. Such a treatment can include for example an oxidative treatment or sintering at temperatures <500° C., or refluxing in inorganic polar solvents; or a plasma treatment, such as $N_2$ or $H_2$ or $O_2$ plasma treatment.

Such a treatment can be carried out to modify the surface of the nanostructured material to immobilize the already previously mentioned linker at the surface of the nanostructured material. With this linkers immobilized at the surface of the nanostructured material, the metal particles or metal oxide particles can bind to these linkers upon precipitation.

After chemical reduction, i.e. precipitation of the metal or metal oxide particles at the surface of the nanostructured material, the thus obtained particle decorated nanostructured material is sieved through a membrane to obtain a network comprised of the particle decorated nanostructured material. The network thus obtained can be used as electrode material for the shared electrode of the hybrid device described herein or as electrode material for any other energy charge storing unit described herein.

The particle or nanoparticle decorated nanostructured material which can be obtained by this temperature deposition-precipitation method can be used to manufacture electrodes for hybrid devices which are characterized by an enhanced energy density of the energy charge storing unit and reduced internal resistance. Galvanostatic studies, electrochemical impedance spectroscopy and sheet resistance measurements suggest that the enhancement with particles can be influenced by the size of the particles and is also related to an improved inter-tube contact resistance in case of using nanotubes.

In one embodiment, the hybrid device described herein is due to its layered structure and the use of materials printable and compatible with roll-to-roll printing processes. Thus, depending on the materials used and the thickness of the components, the hybrid device can be flexible or rigid. In one embodiment, a barrier layer is arranged on one or both sides of the hybrid device illustrated for example in FIGS. 1 to 3. Such a barrier layer can be made of materials which are sensitive to oxygen and moisture and thus seal off the underlying hybrid device against oxidation. The barrier layer can also be scratch resistant to provide more mechanical robustness.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non- limiting examples. In addition, where features or aspects of the invention are described in terms of Markush groups, those skilled in the art will recognize that the invention is also thereby described in terms of any individual member or subgroup of members of the Markush group.

EXPERIMENTAL SECTION

1. Synthesis of Metal Decorated Single Walled Carbon Nanotubes 1.1 Silver decorated single walled carbon nanotubes. To prepare silver nanoparticles decorated single-walled carbon nanotube, 0.08 g of single-walled carbon nanotubes (P3-SWCNTs, Carbon Solution Inc.) were dispersed in 15 mL of deionized water followed by 20 min ultrasonic treatment (120 kW). The dispersion of silver nanoparticles was controlled through pH adjustment (4.3<pH<7.3) using 0.1 M NaOH (99%, Merck) that was added to a 100 mL aliquots of $AgNO_3$ (99.99%, Aldrich) (0.1-0.15 M). The SWCNTs suspension was mixed with the pH adjusted $AgNO_3$ solution and stirred vigorously. The Ag-decorated SWCNTs were separated from the mother liquor by centrifugation (15,000 rpm, 10 min), after that excess Na-ion and nitrate were removed by multiple washing with deionized water. The final product was then redispersed in deionized water before use.

1.2 Gold decorated single walled carbon nanotubes. Gold stock solutions were prepared by adding 0.1 M NaOH (Sigma-Aldrich) dropwise to 20 ml of 3.0-6.3 mM $HAuCl_4$ ($HAuCl_4.3H_2O$, Alfa Aesar) until the pH stabilized at predetermined values ranging from 4 to 12. SWCNTs suspension (0.08 g in 15 mL of deionized water) was dispersed in the solution which was aged at 75° C. with vigorous stirring for certain period (15-60 min) after which the gold loaded catalysts were collected by filtration and washed repeatedly with deionized water to remove chloride.

1.3 Platinum decorated single walled carbon nanotubes. The solution of $H_2PtCl_6.6H_2O$ (3.0-6.3 mM, Aldrich) in deionized water was adjusted to the desirable pH (4-9). SWCNTs suspension (0.08 g in 15 mL of deionized water) was dispersed in the Pt precursor solution followed by the addition of methanol (Merck) as a reductant. The suspension was aged at 75° C. for 10-60 min and washed several times with deionized water.

1.4 Synthesis of $MnO_2$ Nanoflakes

Figure 14:
FIG. 14 shows a TEM image of $MnO_2$ nanoflakes obtained by a method described herein and which were bound on the surface of a nanostructured material. Scale bar 100 nm.

Solution A containing 0.2 g of manganese nitrate $Mn(NO_3)_2$ dissolved in 10 mL of distilled water was added under vigorous stirring to Solution B containing 0.5 g of $KMnO_4$ in 10 mL of distilled water. The resultant solution was stirred for 2 h and then transferred in to a Teflon® lined stainless steel autoclave and placed in the oven at temperatures 140-170° C. for 1-24 h to obtain the product which was washed several times with distilled water until the pH of the solution was 7. This was air dried in an oven at 100° C. for 24 h. Nanoflakes obtained by this method are shown in the TEM image of FIG. 14.

1.5 $MnO_2$ Decorated Single Wall Nanotubes (SWCNT)

Solution A containing 0.2 g-0.5 g of manganese nitrate $Mn(NO_3)_2$ or manganese acetate dissolved in 10 mL-20 mL of distilled water was added under vigorous stirring to Solution B containing 0.5 g-0.9 g of $KMnO_4$ in 10 mL-20 mL of distilled water. 0.05-0.2 g of SWCNT was dispersed in the solution under stirring and heating at 50-80° C. The pH was controlled from 1-7 using 0.01 M HCl or 0.01-0.05 M $HNO_3$ (depending on the pH the $MnO_2$ particle size/dispersity varies). The resulting suspension after stirring for 1-2 h is centrifuged, washed with distilled water and dried in an oven at 100° C. for 24 h.

1.6 Synthesis of $TiO_2$ Nanotubes

Figure 15:
FIG. 15 shows a TEM image of $TiO_2$ nanotubes obtained by a method described herein and used for decoration with metal nanoparticles as described herein. Scale bar 100 nm.

Titania ($TiO_2$) powder 0.5-1.0 g was added to a 15 M solution of sodium hydroxide and stirred vigorously for 2 h. Then the contents were transferred in to a Teflon® lined stainless steel autoclave which was placed in the oven for 4-5 days at 170° C. The resultant dispersion was washed several times with 0.1 mol/L $HNO_3$ till the pH is 7 and then dried in the oven at 80° C. for 24 h. Nanotubes obtained by this method are illustrated in the TEM image of FIG. 15. Using the above methods the $TiO_2$ nanotubes can be decorated with metal nanoparticles.

1.7 Preparation of Supercapacitor Electrodes

In the following the general suitability of the metal decorated nanostructured material as electrode material is demonstrated based on the manufacture of an electrode material for a supercapacitor.

For preparing supercapacitor electrodes, a SWCNT or Ag-decorated SWCNT suspension (0.2 mg/ml in deionized water) was filtered through a filter membrane (Whatman, 20 nm pore size, 47 mm diameter). The CNT were trapped on the surface of the filter, forming an interconnected network. After drying, the freestanding CNT network was peeled off from the filter (thickness about 20 μm) and used as the electrode. For comparison purpose, we also prepared a thin film electrode consisting of 2 wt % Ag powder (Sigma-Aldrich, 2-3.5 μm) and SWCNT by mechanically mixing them in deionized water (0.2 mg/ml) and filtering through a membrane.

1.8 Fabrication of Polymer Electrolyte and Assembly of Supercapacitor

The acidic polymer electrolyte was prepared by heating 5 g of PVA monomer powder (Alfa Aesar, 98-99% hydrolyzed, medium/ high molecular weight) in 50 ml deionized water at 90° C. until a clear gel-like solution was obtained. Subsequently, a 3 ml of $H_3PO_4$ (Sigma-Aldrich, 85% purity) was added into this solution subjected to continuous stirring. Air bubbles in the gel-like solution were removed using vacuum desiccators, and this solution was heated to 60° C. for 4 h to remove excess water, and form a 0.5 mm film of polymer electrolyte. This was stacked in between two strips of Ag-CNT network (FIG. 16a), which were secured on to a polyethylene terephthalate (PET) substrate using double-sided adhesive tape. The polymer electrolyte also acts as the separator between the two electrodes, preventing electrical short-circuit but allowing ionic charge transfer to take place.

1.9 Structural and Electrochemical Characterization

Silver in the Ag-CNTs was characterized from X-ray diffraction (XRD) patterns collected using a Shimadzu diffractometer (CuKα) by step scanning (0.02°, 0.6 s dwell time) over 10° to 140° 2θ range. Transmission electron microscopy (TEM) operating in high resolution mode was conducted using JEOL 2100F operating at a voltage of 200 kV. Capacitance was measured using a two electrode configuration. Cyclic voltammetry and galvanostatic charge/discharge cycle test was carried out using a computer controlled bipotentiostat (Pine Instrument, AFBP1) in the potential range of 0-1 V at scan rate of 20 mVs$^{-1}$ and at the constant current (0.4 to 1 mA), respectively. AC impedance was measured using an impedance spectrum analyzer (Solatron, SI 1255 Impedance/gain-phase analyzer; computer software ZView) at room temperature with AC amplitude of 5 mV, from 55 kHz to 1 mHz at open circuit potential (OCP).

1.10 Optimization of Synthesis Condition for Decoration of Nanostructured Material The findings have shown that pH, reaction time and $AgNO_3$ concentration are the main parameters controlling the dispersion and size of AgNP on SWCNT. After introduction of SWCNTs to 0.15 M $AgNO_3$ solution, the pH decreases from 5.6 to 3.4 as shown in Table 1 due to the presence of the acidic carboxyl groups on the nanotubes.

TABLE 1

Silver nanoparticle characteristics as a function of pH and reaction time for metal decorating single-walled carbon nanotube

| Sample | $AgNO_3$ conc. (M) | pHs[a] | pHsc[b] | pHn[c] | rxn. time (min) | average Ag crystal size[d] (nm) |
|---|---|---|---|---|---|---|
| AgCNT1 | 0.15 | 5.6 | 3.4 | 4.3 | 120 | 15 |
| AgCNT2 | 0.05 | 5.6 | 3.4 | 6.3 | 15 | 1 |
| AgCNT3 | 0.10 | 5.6 | 3.4 | 6.3 | 15 | 3 |
| AgCNT5 | 0.15 | 5.6 | 3.4 | 6.3 | 60 | 4 |
| AgCNT6 | 0.15 | 5.6 | 3.4 | 6.3 | 120 | 6 |
| AgCNT7 | 0.15 | 5.6 | 3.4 | 7.3 | 120 | 10 |

[a]pH of $AgNO_3$ solution.
[b]pH of $AgNO_3$ after added SWCNTs.
[c]pH of suspension after added NaOH.
[d]Determined by TEM.

Figure 17:
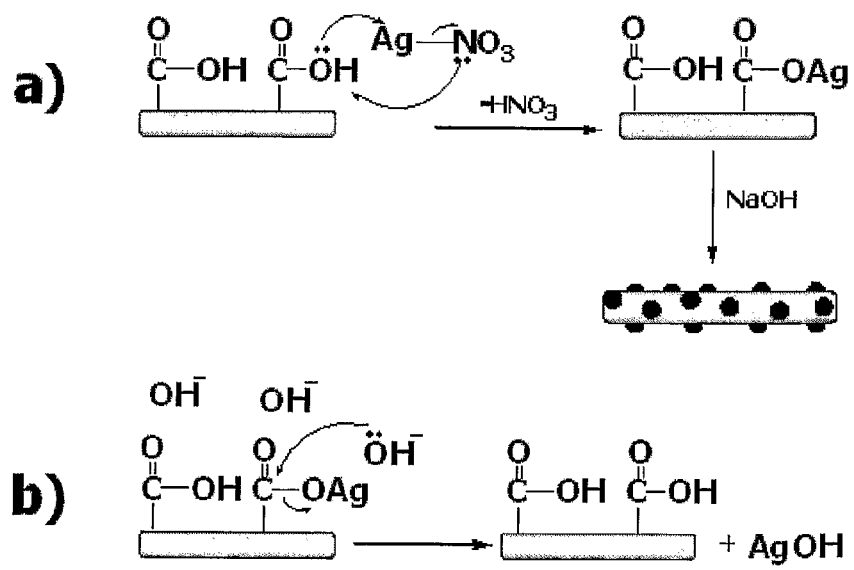
FIG. 17 shows proposed reaction mechanisms for (a) the deposition of silver nanocrystals at carboxyl group of SWCNTs and (b) the resolution of silver hydroxide from SWCNTs surfaces at high pH.
Figure 18:
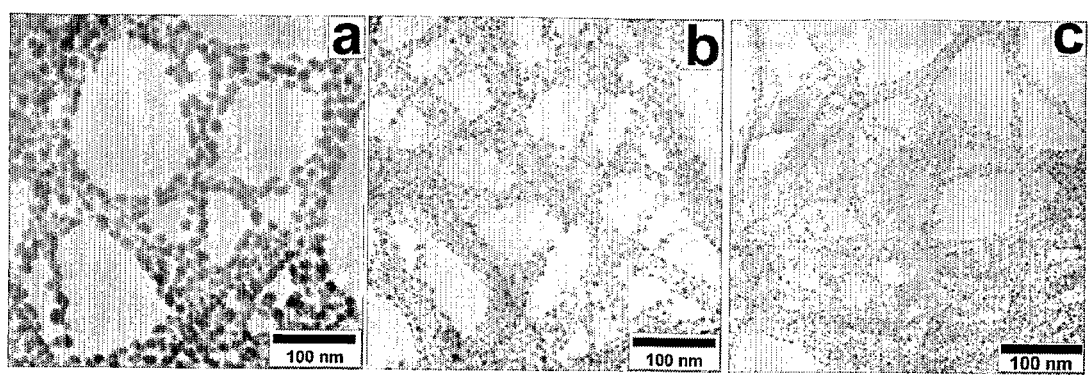
FIG. 18 shows TEM images of Ag-CNT with Ag nanoparticle sizes of (a) 15 nm (b) 6 nm and (c) 3 nm. The images in FIGS. 18(a) and 18(b) are the same as in FIGS. 18(b) and 18(c).
Figure 19:
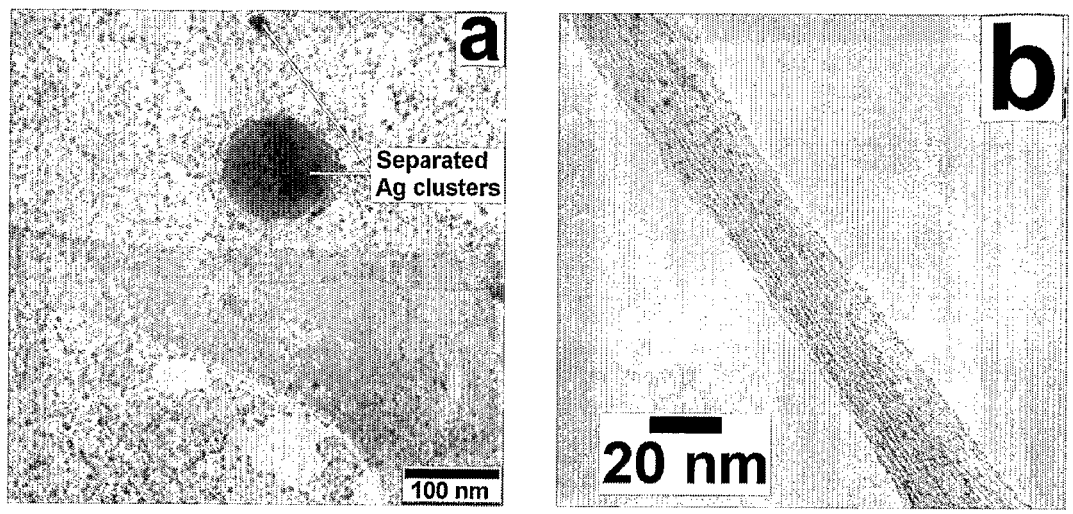
FIG. 19 shows the effect of a varying metal precursor concentration (in this case $AgNO_3$) to the silver decoration of the nanostructured material. (a) Large colloidal silver clusters formation at 0.15 M (Ag-CNT6) and (b) Average size 1 nm at 0.05 M (AgCNT2).
Figure 20:
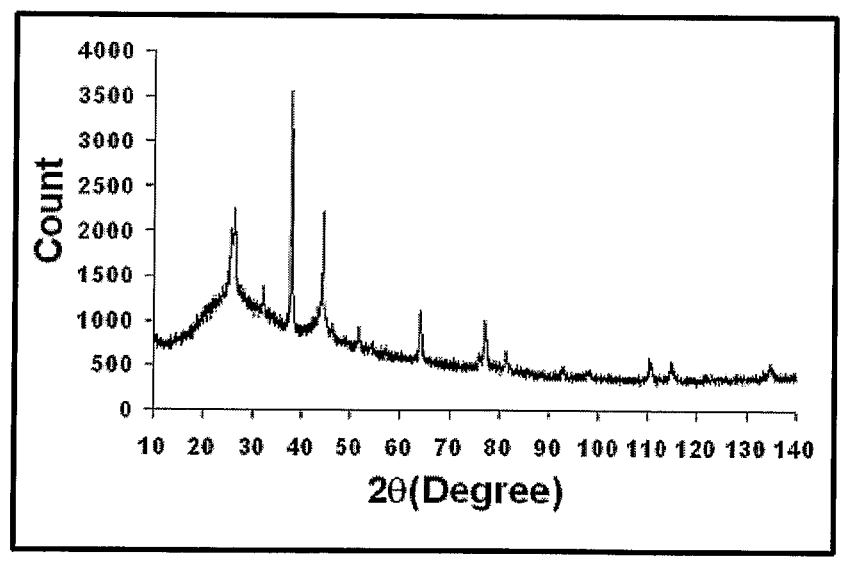
FIG. 20 is a XRD plot showing the metallic silver reflections of AgCNT6.

Subsequently, the absorption of $AgNO_3$ with these groups on the CNT forms COO—Ag groups (FIG. 17). The addition of NaOH solution is a critical step in controlling pH to ensure that the quantity of hydroxyl ions is sufficient for the progressively reduction of $Ag^I$ to $Ag^0$. Table 1 shows the silver nanoparticle size of three different samples as a function of pH and reaction time. At pH 4.3 (after added NaOH), the Ag nanoparticle size decorated on SWCNTs was the largest with the diameter about 15 nm (FIG. 18a). As the pH increases to 6.3, the Ag nanoparticles size dramatically decreases to 6 nm (FIG. 18b) for the same reaction time. This phenomenon might be due to the reaction between excess hydroxyl ions and the COO-Ag groups at higher pH, which promotes the reformation of carboxyl groups on SWCNTs with concomitant release of Ag—OH. Consequently, the number of available nucleation sites and the growth of Ag nanoparticles decrease. By the reducing of aging time from 120 min to 15 min (at the same pH condition), the size of the Ag nanoparticles decreases from 6 nm to 3 nm (FIGS. 18b and 18c). This indicates that longer reaction time actually yielded larger Ag nanoparticles through the crystal growth and aggregation after nucleation. The variation of $AgNO_3$ concentrations (0.05-0.15 M, pH 6, aging time 15 min) was studied to optimize the condition which the colloidal Ag cluster formation can be prevented. At the excess Ag precursor than required for nucleation and growth (0.15 M), the mixture of large colloidal Ag clusters (20-100 nm, FIG. 19a) and Ag decorated on SWCNTs (3 nm) were formed. The absence of Ag clusters with constant size of Ag on SWCNTs as 0.15 M condition was obtained when reduced the $AgNO_3$ concentration to 0.10 M. The lower dispersion and smaller silver crystal size, 1 nm, on SWCNT surfaces (FIG. 19b) were achieved at 0.05 M $AgNO_3$ solution. XRD pattern (FIG. 20) confirms the formation of cubic $Ag^0$ at 2θ=38, 45, 64, 78, and 82.

1.11 Supercapacitor Electrochemical Device Testing

Cyclic voltammograms for six supercapacitor device types with following electrode materials: reference device with CNT electrode, Ag-decorated CNT for four different AgNP size ranges: 13±2 nm, 7±1 nm, 4±1 nm, and 1 nm (1-2 nm size range), and the 2 wt % Ag powder—CNT mixture (2% Ag+CNT) are presented in FIG. 16e. The specific capacitance of all the devices as determined using both cyclic voltammetry (CV; FIG. 16e) and galvanostatic charge and discharge (GCD; FIG. 16f) methods, ranged from 0.03-0.24 F/cm$^2$ with the reference CNT devices showing good agreement with literature values. Specific capacitance was normalized with area rather than mass per electrode as unlike liquid electrolytes, polymer electrolyte only wets the surface of the electrode and hence only the surface rather than the entire mass of Ag-CNT electrode would contribute to the formation of the electrical double layer. The specific capacitance of a dense CNT network is 0.09 F/cm$^2$ and its CV curve shows the peak at 0.2 V, which can be attributed to oxygen containing functional groups contributing as pseudocapacitance to the overall capacitance. Functional groups, surfactants, and impurities contributed by the CNT synthesis and device fabrication process, internal and external device resistance resulting from unoptimized device construction and external device contacts are thought to lead to the deviations from the box-shaped CV characteristics of an ideal supercapacitor.

nanotubes and may also increase the effective surface area aided by the cluster of Ag atoms that create small protrusions on the CNT surface. A 1 nm AgNP is estimated to consist of about 31 Ag atoms, which may result in an increased effective surface area that may contribute to enhanced capacitances observed for the 1 nm Ag-CNT and the 4 nm Ag-CNT devices.

The role of Ag in contributing to the pseudocapacitance was further investigated by studying devices in which the electrode is prepared by physically mixing 2 wt % of Ag particles into the CNT, denoted as 2% Ag+CNT device. The recorded capacitance, 0.12 F/cm$^2$, was higher than that for

TABLE 2

Specific capacitance, internal resistance and sheet resistance measured for all devices using both CV and GCD methods.

| Sample | Area per electrode (cm$^2$) | Mass per electrode (mg) | C (F/cm$^2$) CV | C (F/cm$^2$) Galv | C (F/g) CV | C (F/g) Galv | Energy density (Wh/kg) | Power density (kW/kg) | R (ohm) | Sheet Resistance ($\Omega$ cm$^{-2}$) |
|---|---|---|---|---|---|---|---|---|---|---|
| P3CNT | 0.56 | 1.10 | 0.09 | 0.082 | 46.5 | 41.9 | 1.5 | 2.7 | 83.19 | 15.74 |
| 13 nm-AgCNT | 0.60 | 1.20 | 0.046 | 0.033 | 22.8 | 16.5 | 0.7 | 1.3 | 159.92 | 10.26 |
| 7 nm-AgCNT | 0.70 | 1.40 | 0.087 | 0.060 | 43.4 | 28.3 | 1.2 | 2.4 | 72.83 | 5.91 |
| 4 nm-AgCNT | 0.54 | 1.23 | 0.15 | 0.100 | 67.5 | 44.8 | 1.9 | 3.1 | 65.49 | 6.34 |
| 1 nm-AgCNT | 0.52 | 1.22 | 0.244 | 0.206 | 105.8 | 89.4 | 3.3 | 2.5 | 83.00 | 10.20 |
| 2% Ag + CNT | 0.54 | 1.65 | 0.120 | 0.120 | 39.3 | 39.0 | 1.4 | 1.1 | 140.79 | 5.08 |

Figure 21:
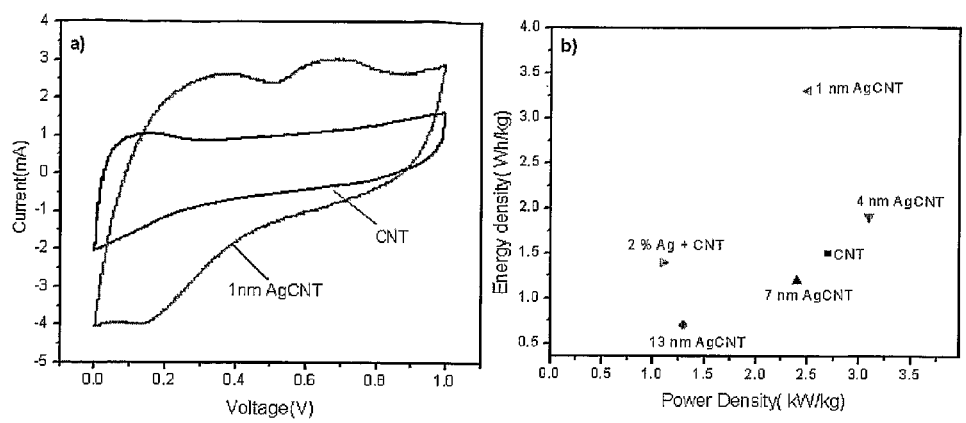
FIG. 21(a) Cyclic voltammograms for 1 nm Ag-CNT and CNT devices which clearly shows redox peaks observed for 1 nm Ag-CNT in 1 M $H_3PO_4$ liquid electrolyte and FIG. 21(b) shows the energy density and power density plots for all supercapacitor devices.

In comparison, redox peaks at V=0 and 1 V can be observed for 1 nm Ag-CNT and 4 nm Ag-CNT, which also exhibit significantly larger specific capacitances of 0.24 F/cm$^2$ and 0.15 F/cm$^2$, respectively. These redox peaks are seen more clearly by using 1 M H$_3$PO$_4$ liquid electrolyte, due to the higher mobility of ions contained in the liquid electrolyte as compared to the solid-state aqueous electrolyte (FIG. 21a). The appearance of the redox peaks strongly suggests that the mechanism in enhancing the capacitance in the 1 nm Ag-CNT and 4 nm Ag-CNT devices may be attributed to the fact that the Ag-NPs participate as Faradaic reversible redox sites leading to a pseudocapacitance contribution to the overall specific capacitance. Thus the overall specific capacitance may be viewed as a combined contribution of an electrical double layer capacitance and a pseudocapacitance; the former influenced strongly by the surface area whereas the latter influenced by the presence of Ag.

The specific capacitance (shown as energy and power density in FIG. 21b) of supercapacitors decreases with increasing particle sizes with 4 nm Ag-CNT, 7 nm Ag-CNT, and 13 nm Ag-CNT devices yielding values of 0.15 F/cm$^2$, 0.09 F /cm$^2$, and 0.05 F/cm$^2$ respectively. Similar observations were also obtained from the measurement of specific capacitance using galvanostatic charge and discharge method, with the capacitance values (Table 2) minoring the cyclic voltammetry results.

The decrease in the specific capacitance of the devices with larger AgNPs (e.g. 7 nm Ag-CNT and 13 nm Ag-CNT devices) may be attributed to the pore blockage of CNT by larger AgNP, resulting in a reduction of the effective surface area and thus reducing the electrical double layer capacitance. On the other hand, smaller AgNP (with diameter <5 nm) are less likely to block the mesopores of the carbon the reference CNT, 13 nm Ag-CNT, and 7 nm Ag-CNT devices (>5 nm AgNP), but lower than the 4 nm Ag-CNT and 1 nm Ag-CNT devices (<5 nm AgNP). The capacitance of this 2% Ag+CNT device is higher than the reference CNT device suggesting that the Ag particles did not block the CNT surface and that the Ag did contribute through its pseudopacitance. The observations detailed in the preceding paragraphs thus may be summarized as follows: specific capacitance in Ag-CNT supercapacitors comprises of contributions from the electrical double layer capacitance and from pseudocapacitance; with the former governed primarily by surface area whereas the latter influenced strongly by the size of the AgNPs. Smaller AgNPs do not decrease the overall surface area; whereas they enhance the pseudocapacitance thus resulting in a specific capacitance enhancement of up to about 150% for 1 nm Ag-CNT over the reference CNT devices.

1.12 Supercapacitor Impedance Testing

Low internal resistance is of critical importance in supercapacitors, since it is one of the limiting factors for power density (P=V$^2$/4R) and also influences the charge-discharge cycles. In supercapacitors, a number of sources contribute to the internal resistance and are collectively measured and referred to as the equivalent series resistance, or ESR. Contributors to the ESR of supercapacitors include sheet resistance of the electrode, interfacial resistance between the electrode and the electrolyte, ionic resistance of the electrolyte, and the external lead contact resistance. The sheet resistance, as measured at several points on the network using a probe station, decreases from 15.74 $\Omega$ cm$^{-2}$ for the reference CNT device to 10.20 $\Omega$ cm$^{-2}$ and 6.34 $\Omega$ cm$^{-2}$ for devices comprising 1 nm and 4 nm AgNP, respectively. As expected, adding the AgNP into CNT network does lead to a reduction in the sheet resistance, presumably due to the reduction in the inter-tube resistance; however, this trend reverses with increasing AgNP particle sizes, with the 7 nm Ag-CNT and 13 nm Ag-CNT devices showing resistances of 6.34 Ω cm$^{-2}$ to 10.26 Ω cm$^{-2}$, respectively.

Figure 16:
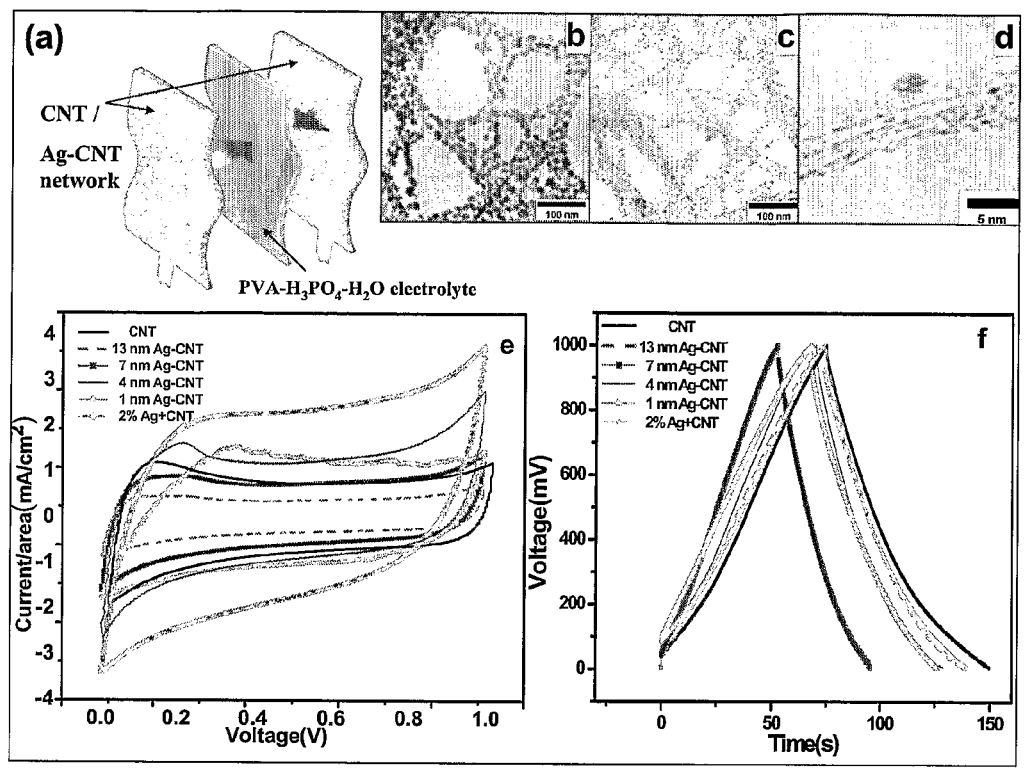
Figure 22:
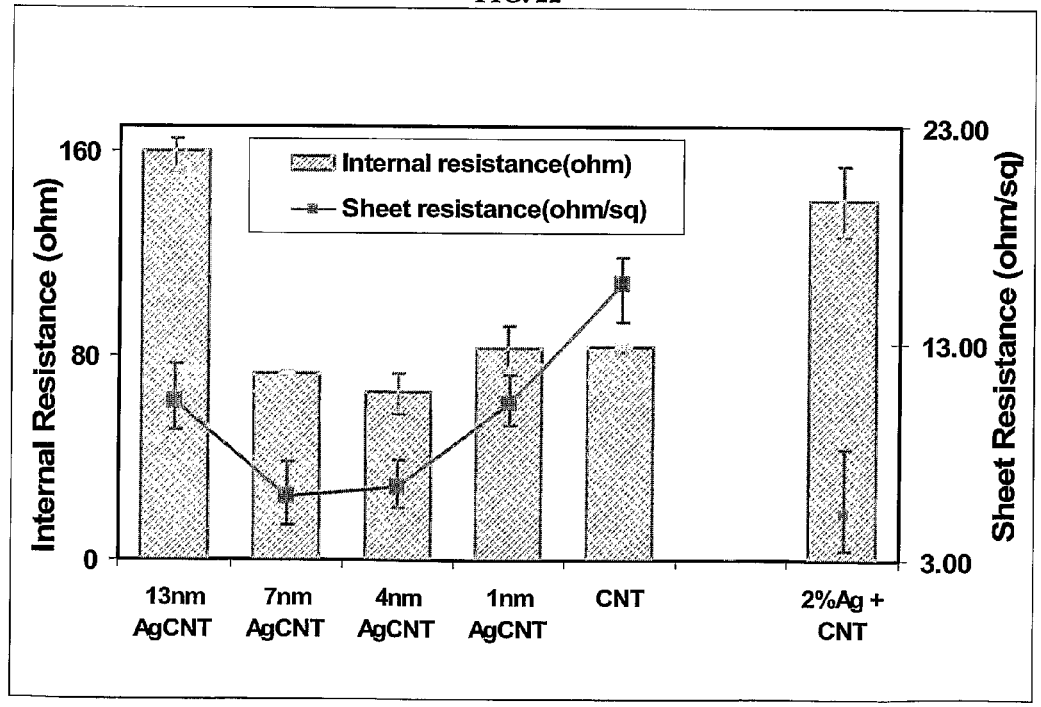
FIG. 22 is a bar chart which shows the internal resistance and sheet resistance measured for the supercapacitor devices already referred to in FIG. 16.

These observations are further confirmed by the internal resistance measurements obtained from the galvanostatic charge and discharge test (FIG. 16$f$). From the voltage (IR) drop at the beginning of the discharge curve, the internal resistances for the CNT electrode was found to be 83.2 Ω. Incorporation of AgNP into the CNT network yields internal resistances of 83 Ω and 65 Ω for 1 nm Ag-CNT and 4 nm Ag-CNT; however, the 7 nm Ag-CNT, 13 nm Ag-CNT, and 2% Ag+CNT devices display internal resistances of 68 Ω, 160 Ω, and 141 Ω, respectively, which is similar to the observations from sheet resistance measurement. The result of both internal resistance and sheet resistance of the electrode are represented by the bar chart (FIG. 22) for giving a clearer overview on the correlation between AgNP sizes and both the internal resistance and sheet resistance of the devices.

The effect of AgNP on supercapacitor performance and the electrochemical behavior of Ag-CNT electrodes was further investigated with AC impedance spectroscopy (FIG. 23$a$). An intersection occurs in the real axis in the high frequency region, followed by a single quasi-semicircle in low frequency region. This semicircle in the high frequency region can be attributed to (1) the presence of an interface between the electrode and the electrolyte, and (2) the presence of a RC loop involving a double-layer capacitance in parallel with a resistance. At low frequency, the plot transforms to an almost vertical line, corresponding to the capacitive response of porous carbons. The non-vertical slope of the impedance plot at low frequency of supercapacitor may be ascribed to different pore size distribution carbons, and low mobility of ions inside the electrodes. An equivalent circuit for Ag-CNT electrodes would involve the following circuit elements: the bulk solution resistance, $R_e$; the double layer capacitance, $C_{dl}$, the interfacial charge transfer resistance, $R_{ct}$, and the Warburg impedance due to distributed resistance within the mesopores, $W_s$. Since both active material and current collector was combined into a single component in the devices, $C_b$ and $R_b$ correspond to the capacitance and resistance within the electrode. For 1 nm Ag-CNT and 4 nm Ag-CNT particularly, an additional element of $C_p$, corresponding to pseudocapacitance needed to be included in the equivalent circuit. The combination of the circuit elements are proposed and shown in FIGS. 23$b$ and 23$c$, respectively. Accordingly, the overall impedance, Z, of the equivalent circuit for CNT, 13 nm Ag-CNT, 7 nm Ag-CNT and 2% Ag-CNT devices without the presence of pseudocapacitance is given by:

$$Z = R_s + \frac{R_b}{j\omega R_b C_b + 1} + \frac{R_{ct}}{j\omega R_{ct} C_{dl} + 1} \quad (1)$$

As for 4 nm Ag-CNT and 1 nm Ag-CNT devices with an additional element of pseudocapacitance, the equation of the impedance, Z is expressed as:

$$Z = R_s + \frac{R_b}{j\omega R_b C_b + 1} + \frac{1}{j\omega C_{dl} + \frac{j\omega C_p}{j\omega R_{ct} C_p + 1}} \quad (2)$$

Equation (1) and (2) together with the impedance data in FIG. 23$a$ were employed to estimate the values of the elements of the equivalent circuit in FIGS. 23$b$ and 23$c$. The estimated values are summarized (Table 3).

TABLE 3

Components of the equipment circuit fitted for the impedance spectra

| Sample | $R_b$ (Ω) | $R_{ct}$ (Ω) | $C_b$ (μF cm$^{-2}$) | $C_{dl}$ (Fcm$^{-2}$) | $C_{dl} + C_p$ (Fcm$^{-2}$) |
|---|---|---|---|---|---|
| CNT | 1.511 | 28.13 | 18.252 | 0.03 | — |
| 13 nm Ag-CNT | 0.84 | 87.24 | 46.883 | 0.017 | — |
| 7 nm Ag-CNT | 2.301 | 47.8 | 13.611 | 0.01 | — |
| 4 nm Ag-CNT | 0.945 | 3.773 | 18.699 | — | 0.054 |
| 1 nm Ag-CNT | 0.467 | 1.38 | 50.409 | — | 0.117 |
| 2% Ag-CNT | 0.61 | 26.38 | 36.515 | 0.035 | — |

The electrolyte resistance was approximately 65 Ω, this relatively higher value as compared to the liquid electrolyte (<10 Ω) is mainly due to the lower mobility of ions within the polymer electrolyte. The $R_{ct}$ value for each Ag-CNT electrode accounts for a major proportion of the overall resistance, whereas the $R_b$ plays a minor role. The charge transfer resistance, $R_{ct}$, decreases as the AgNP sizes become smaller, and a significant decrease is observed for 4 nm Ag-CNT and 1 nm Ag-CNT devices, with $R_{ct}$ in the range of 1-4 Ω (Table 3). This observation indicates that AgNP in the size range of 1-5 nm effectively reduce the resistance between the CNT electrode and the electrolyte; whereas, larger AgNPs (>7 nm) possibly reduce the electrochemical redox kinetics by blocking the pores on the CNT surfaces, yielding $R_{ct}$ values of 87 Ω for 13 nm Ag-CNT device; significantly higher even than the reference CNT device (about 28 Ω).

The double layer capacitance, $C_{dl}$, obtained from impedance analysis increases as AgNP reduces from 7 to 1 nm, which is analogous to the observation from CV measurement. The pseudocapacitance, $C_p$, for 4 nm Ag-CNT and 1 nm Ag-CNT devices contributed to the overall capacitance as $C_{dl}+C_p$. Again, 1 nm Ag-CNT has the highest capacitance among all the devices, further supporting the findings from CV measurements, which indicate that pseudocapacitance is an important contributor to the enhancement of capacitance for the <5nm AgNP devices. The values of $R_b$ and $C_b$ (contribution from the electrodes) were negligibly small compared to the overall resistances and capacitances (Table 3).

Fermi level alignment is expected to occur whenever a contact is formed between a metal and a semiconductor resulting in charge redistribution and the formation of a depletion layer surrounding the metal. The Ag-decorated CNTs will also experience such an effect and create a localized depletion region, acting as a charge scattering site and creating a potential barrier within the nanotube, leading to a decrease in mobility and intra-tube conductivity. It may be argued that the depth of the depletion region (and potential barrier) increases with the number of atoms in the nanocluster, reaching a maximum value somewhere in the 5-20 nm range, beyond which this depth may remain constant; the width however increasing with increasing coverage of the Ag nanoparticles. The contact resistance between metallic-metallic and semiconducting-semiconducting tubes is known to be negligible. On the other hand, the significant inter-tube contact resistance between semiconducting-metallic CNTs has been attributed to the creation of a Schottky barrier. The semiconducting-metallic CNT junction mediated with Ag nanoparticles on the other hand leads to a reduction in the Schottky barrier thus reducing the inter-tube contact resistance.

The observations of increased sheet resistance and internal resistance can now be discussed in the context of the effect of Ag on the intra-tube as well as the inter-tube resistances. One may argue that the intra-tube resistance with 13 nm AgNP is probably highest amongst all the AgNP sizes evaluated in this study, 1 nm to 13 nm. The inter-tube resistance on the other hand is probably highest for the 1 nm AgNP device owing to the Ag coverage on the CNT surface. Adding AgNP to CNT leads to a reduction in sheet resistance from about 15 $\Omega cm^{-2}$ for the reference device to about 10 $\Omega cm^{-2}$ (13 nm AgNP), about 6 $\Omega cm^{-2}$ (7 and 4 nm AgNP), and about 10 $\Omega cm^{-2}$ (1 nm AgNP) with decreasing Ag sizes. The reduction in sheet resistance for the 13 nm and 7 nm device may be attributed to improved inter-tube contact whereas for the smaller AgNP devices, the probability of a Ag mediated CNT-CNT contact has reduced due to the reduced size/surface coverage of Ag on the CNTs and therefore, the sheet resistance for the 1 nm AgNP-CNT increases slightly to about 10 $\Omega cm^{-2}$ which is still lower than the reference (about 15 $\Omega cm^{-2}$). The sheet resistance for 2% Ag-CNT device is the lowest at 5 $\Omega cm^{-2}$ arguably due to large silver clusters and possible percolation paths within the 2-5 μm silver particles. The response of the internal resistance on the other hand comprehends electrolyte effects in addition to the inter and intra-tube contact resistance issues and although does show some AgNP dependence, it is best compared with the EIS; and previously described, the ionic diffusion resistance resulted from the pore blockage by large AgNP results in high internal resistances of 160 Ω and 141 Ω for the 13 nm AgNP and the 2% Ag+CNT device, respectively.

Thus, it can be said in summary that a metal-decorated nanostructured material has been demonstrated to be an effective charge collector and electrode material for supercapacitors. Capacitance per area of the device can be increased by decorating CNT with silver nanoparticles of size smaller than about 5 nm which will not block the mesopores of the CNT and complement the double layer capacitance by a Faradaic reaction induced pseudocapacitance. The internal resistance of the device can also be reduced by adding in the AgNP with size ranging from 3-8 nm. The presence of AgNP can help in reducing the inter-tube contact resistance of the CNT and leading to a decrease in the overall internal resistance of the device, which is important in improving the power density.

2. Manufacture and Testing of a Hybrid device

In the following the manufacture of a hybrid device is described. In this exemplary embodiment, the hybrid device comprises an organic photovoltaic (OPV) as energy converting unit and a supercapacitor as energy charge storing unit.

2.1 Fabrication of Organic Photovoltaic (OPV)

ITO-coated glass slides (Kintec Company, 7 $\Omega cm^{2}$) are etched with HCl (37 wt % in deionized (DI) water), then cleaned by using detergent, DI water, acetone and isopropanol. Each step is done by ultra-sonicating the substrate for 15 minutes. The substrates are blown dry using $N_2$ and plasma, cleaned for 2 minutes to remove remaining dirt and for surface treatment of ITO. PEDOT:PSS solution is spin coated onto the substrates after the plasma cleaning process at 3000 rpm for 30 s and thickness of about 30 nm can be obtained. After spin coating, substrates are transferred to glove box and baked on a hotplate for 10 minutes to remove moisture. Blend of P3HT (poly(3-hexylthiophene-2,5-diyl) purchased from Rieke Metals, Inc):PCBM ([6,6]-Phenyl $C_{61}$ butyric acid methyl ester purchased from Nano-C) (1:1 by weight, 10 mg/ml) is stirred overnight at 50° C. before ready for spincoating at 700 rpm for 30 s to get the active layer with typical thickness of about 100 nm. Deposition of patterned Al cathode is done by using shadow mask in vacuum ($10^{-6}$ mbar)at evaporation rate of 0.2 Å/s to obtain thickness of about 100 nm. The OPV fabrication is completed with annealing after Al deposition at 150° C. for 30 minutes, the device configuration is as shown in FIG. 5(a).

2.2 Fabrication of Supercapacitor

For preparing the supercapacitor, the single-walled carbon nanotubes (P3-SWCNT purchased from Carbon Solution Inc.) P3-SWCNT was purified with nitric acid and left in highly functionalized form. P3-SWCNT contains 1.5 - 3.0 atomic% carboxylic acid. These SWCNTs were filtered through a filter membrane (Whatman, 20 nm pore size, 47 mm diameter). The CNT were trapped on the surface of the filter, forming an interconnected network. After drying, the freestanding CNT network film (thickness about 20 μm) was peeled off from the filter and used as the cathode of the supercapacitor. The acidic polymer electrolyte was prepared by heating 5 g of polyvinyl alcohol (PVA) monomer (Alfa Aesar, 98-99%, medium/ high molecular weight) in 50 ml deionized water at 90 ° C. to obtain a clear gel-like solution to which 3 ml of $H_3PO_4$ (Sigma-Aldrich, 85% purity) was added under continuous stirring. Air bubbles and excess water in the gel-like solution were removed using a vacuum desiccator, and heating to 60° C. for 4 h respectively to obtain a polymer electrolyte film (0.5 mm thickness) that also acts as the separator between the two electrodes, preventing electrical short-circuit but allowing ionic charge transfer to take place. Supercapacitor devices were fabricated by stacking this polymer electrolyte film in between two electrode strips of CNT (FIG. 5(b), which were secured onto a polyethylene terephthalate (PET) substrate using double-sided adhesive tape. Electrochemical measurements were carried out for the supercapacitor on two electrode configuration using a computer controlled bipotentiastat (Pine Instrument, AFBP1).

2.3 Integration of OPV and Supercapacitor

For integrating both OPV and supercapacitor, a CNT solution with concentration of 3 mg/ml in Isopropanol is drop-casted on top of the Al cathodes of OPV at room temperature to create a CNT network which acts as the electrode of the supercapacitor. This then followed by the stacking of a free-standing PVA (polyvinyl alcohol) contained $H_3PO_4$ thin film with thickness about 0.5 mm on top of the CNT network, which acts as both separator and electrolyte of the supercapacitor. The final step is done by stacking another free-standing CNT network on top of the PVA-$H_3PO_4$ thin film, such that the PVA-$H_3PO_4$ thin film is sandwiched in between two CNT networks. An illustration of a hybrid device thus obtained is shown in FIG. 5(c) left image. Alternatively, the shared electrode of the hybrid device can also be formed by a metal-decorated CNT (e.g. Ag-CNT) as illustrated in FIG. 5(c) right image. Metal-decorated nanostructured material, such as Ag-CNT can be manufactured according to the methods described above under 1.

2.4 Results of Measurements Using the Supercapacitor Referred to under 2.2

Figure 6:
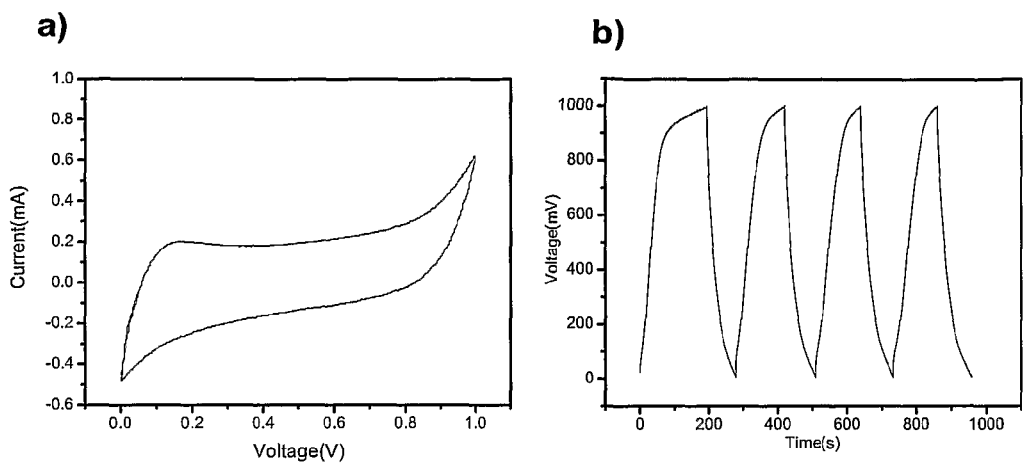
FIG. 6(a) shows a cyclic voltammogram and FIG. 6(b) shows galvanostatic charge and discharge curves for supercapacitor devices with SWCNT electrode and PVA acidic polymer electrolyte.

Cyclic voltammograms (CV) and galvanostatic charge-discharge (GCD) curves of the supercapacitor device with SWCNT electrode and PVA acidic polymer electrolyte are shown in FIGS. 6(a) and 6(b). The results are representative for a standalone supercapacitor as well as for a supercapacitor forming the energy charge storing unit of a hybrid device described herein. The CV measurements are carried out at the scan rate of 20 mV/s at room temperature. The nearrectangular shape of the CV curves indicates good capacitive characteristics of the device, with specific capacitance of 84.5 F/g. Charge-discharge behavior was measured at a constant current of 0.2 mA. From both measurements, a power density of 0.15 kW/kg and energy density of 2.96 Wh/kg are obtained at room temperature for the supercapacitor device, which are within reported ranges (0.01-10 kW/kg) of commercial supercapacitors and comparable to flexible devices reported.

2.5 Results of Measurements Using the Organic Photovoltaic (OPV) Referred to under 2.1

Figure 7:
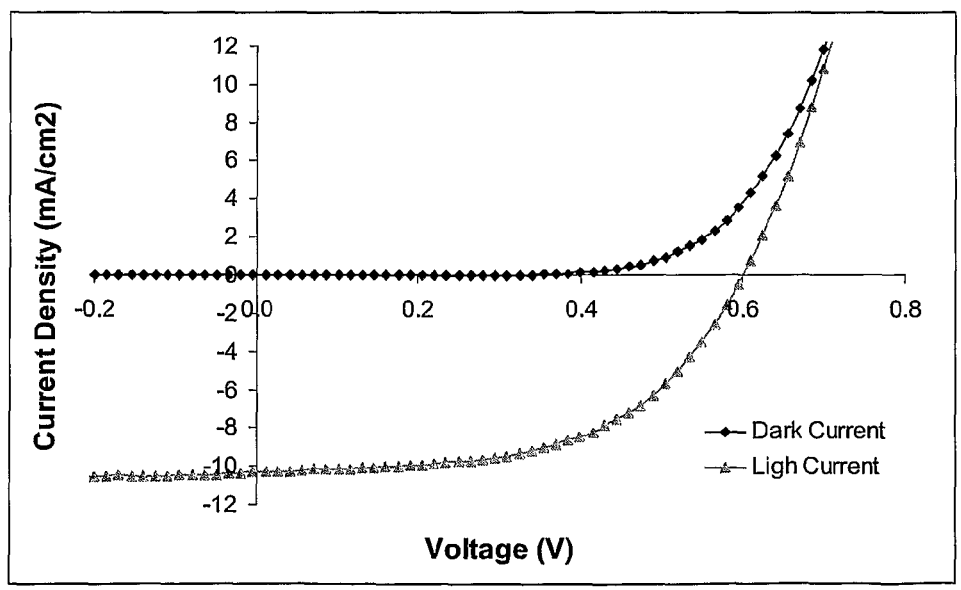
FIG. 7 shows I-V curves under AM 1.5G illumination of the P3HT:PCBM-based OPV device used to construct the hybrid device.

The OPV performance of an OPV forming part of a hybrid device was characterized by measuring the I-V characteristics in ambient under Air Mass (AM) 1.5G illumination (100 mW/cm$^2$). The I-V curves of both dark and light current are shown in FIG. 7. The dark current profile shows an ideal behavior of a diode. As observed in the light current profile, short-circuit current density (Jsc) as high as 10.37 mA/cm$^2$ could be generated by the thermally annealed OPV when no bias was applied. The device yielded open circuit voltage (Voc) of about 598 mV which also set as the highest voltage achievable in charging the supercapacitor in the hybrid device. Analysis of the shunt resistance of the device gave low value of 12 $\Omega$cm$^2$ which was expected judging from its relatively high fill factor (FF) of 55%. This device gave power conversion efficiency (PCE) of 3.39%. The abovementioned parameters were observed with slight variation among devices in the same substrate.

Figure 8:
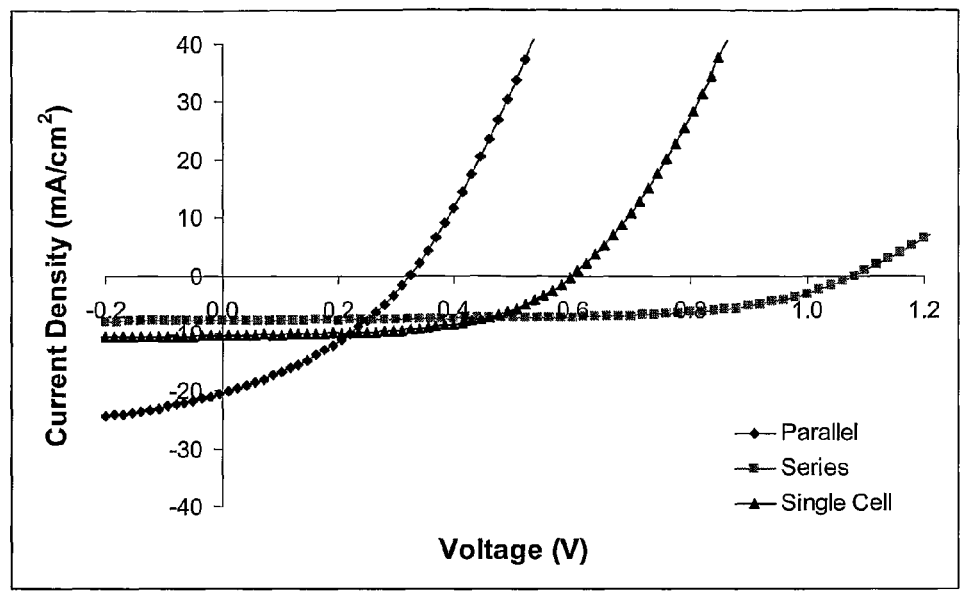
FIG. 8 shows I-V curves under AM 1.5G illumination of the P3HT:PCBM-based OPV device connected in series as well as in parallel.

Connecting the OPV devices on the same substrate in parallel is supposed to generate more current for charging supercapacitor. The analysis of the I-V curve in FIG. 8 shows Jsc improvement (23.40 mA/cm$^2$) of more than twice through parallel connection. Nevertheless this improvement in current is not a linear one, attributed to the high additional resistance when devices were connected. This point is supported by the lower FF (38%) of the whole devices. While current improvement was observed, Voc remained very much similar to that of single device at 580 mV. When devices were connected in series, significant increase in Voc (about 1000 mV) was observed while the Jsc remains close to the behavior of a single cell (7.75 mA/cm$^2$).

2.6 Results of Measurements with the Hybrid Device Shown on the Left of FIG. 5(c) Left Image (Al+CNT as Shared Electrode)

Figure 9:
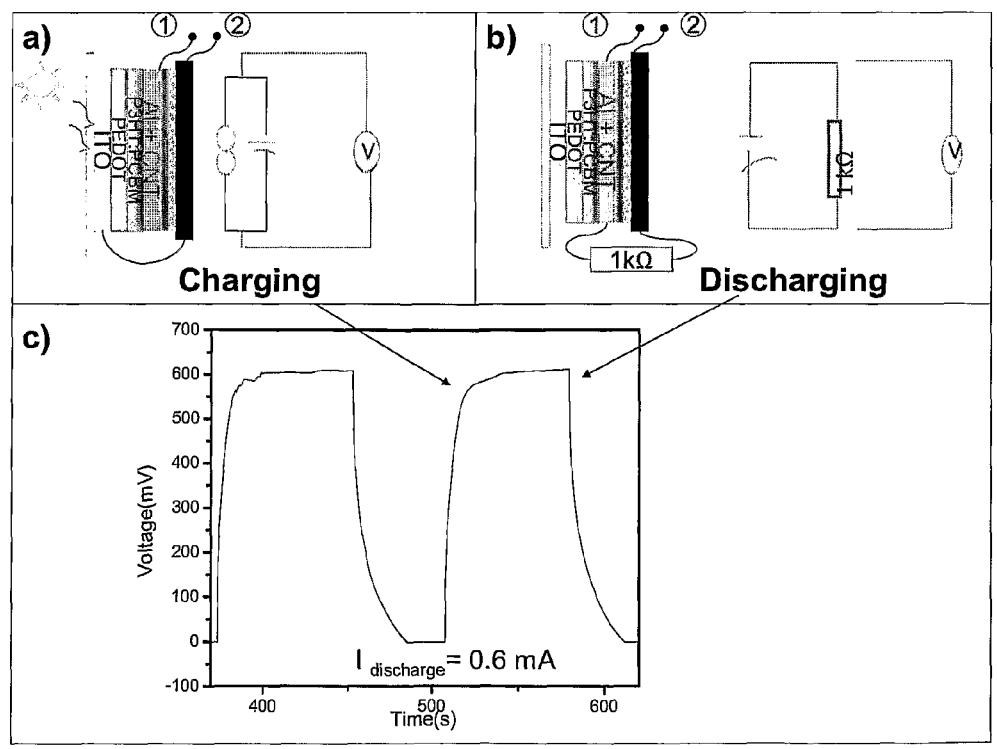
FIG. 9 shows a schematic illustration and circuit illustration of a hybrid energy storage device with drop-casted CNT network on Al cathode as shared electrode during (a) charging process (b) galvanostatic discharge, which is done by connecting a 1 kΩ resistor in parallel to the hybrid device. The charge and discharge curves of the hybrid device are plotted as a function of time in FIG. 9(c).

It was demonstrated that the OPV and supercapacitor devices referred to under item 2.1 and 2.2 could be integrated in parallel to build hybrid device. In this case, the common interface of this hybrid device consists of Al cathode of the OPV and drop-casted CNT electrode of the supercapacitor (terminal 1), and an electrical connection is created between ITO and another CNT electrode of the supercapacitor (terminal 2) as shown in FIG. 9(a). During charging process, OPV converted solar energy to electrical current which flows from anode (ITO) to the cathode (Al electrode), and charged the adjoining supercapacitor. When the supercapacitor is fully charged, both the light source and the electric connection are removed, the galvanostatic discharge can be done by connecting a 1 k$\Omega$ resistor in parallel to the terminal 1 and 2 of the supercapacitor as shown in FIG. 9(b), to act as a load which draws a constant current of 0.6 mA from the supercapacitor. The charge and discharge curves of the supercapacitor are plotted as a function of time as shown in FIG. 9(c). For galvanostatic discharge with constant current of 0.6 mA, the internal resistance of the supercapacitor is found to be 180 $\Omega$.

2.7 Results of Measurements with the Hybrid Device Shown on the Right of FIG. 5(c) (Ag Decorated CNT as Shared Electrode)

Figure 10:
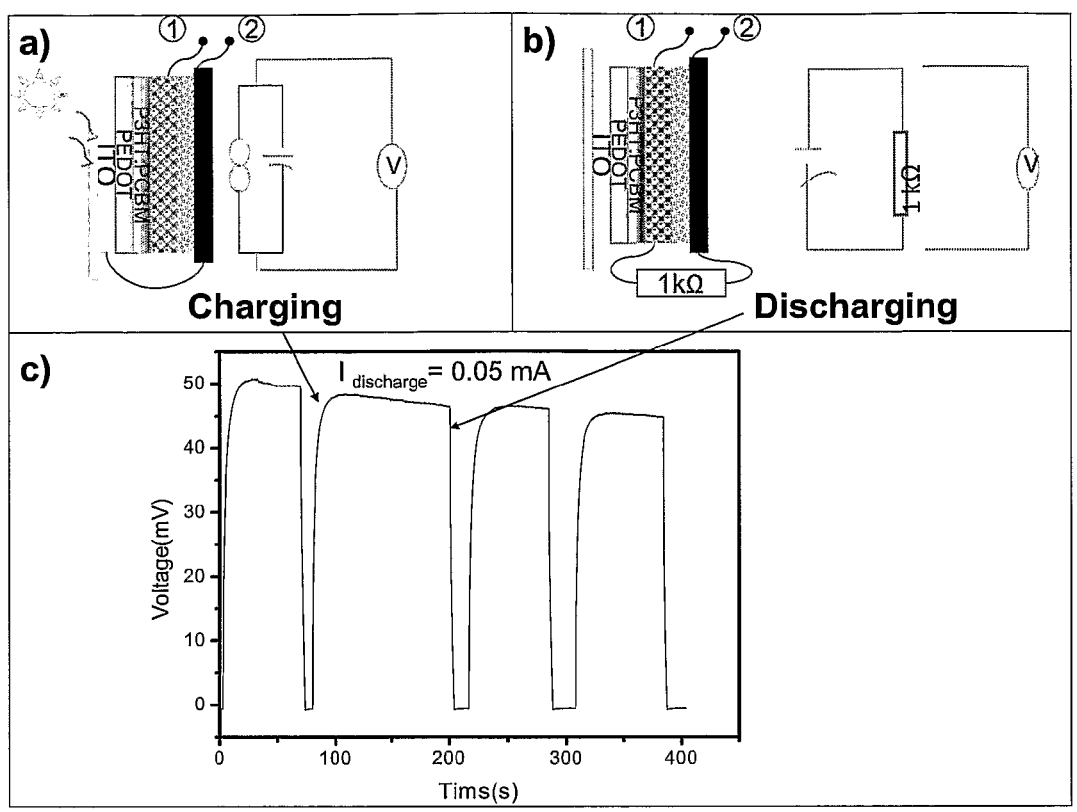
FIG. 10 shows a schematic illustration and circuit illustration of a hybrid energy storage device with Ag decorated CNTs (Ag-CNT) as shared electrode during (a) charging process (b) galvanostatic discharge, which is done by connecting a 1 kΩ resistor in parallel to the hybrid device. The charge and discharge curves of the hybrid device are plotted as a function of time in FIG. 10(c).

Another embodiment of integrating both OPV and supercapacitor using metal decorated nanostructured material as shared electrode has also been demonstrated based on Ag decorated single walled carbon nanotubes (Ag-CNT). This can be done by drop-casting the Ag-CNT with a concentration of 3 mg/ml directly onto the active layer (P3HT: PCBM) of OPV. The charge and discharge of the hybrid device can be done in a similar way as mentioned under item 2.6. As shown in FIG. 10(c), for galvanostatic discharge with external load of 1 k$\Omega$, the supercapacitor can be charged up to 50 mV, which is the open circuit voltage of OPV with Ag electrode, and discharge with the rate of 9.2 V/s.

2.8 Connecting the Hybrid Device Referred to under Item 2.6 in Series

It was also demonstrated that upon connecting two OPV in series as shown in FIG. 11(a), one can increase the charging voltage twice as high as compared to just using single OPV. The charge and discharge curve of the hybrid device by using two OPV in series are plotted as a function of time as shown in FIG. 11(b). Hence, the hybrid device can be charged up by OPV during day time, and the charge is being stored in the supercapacitor which acts as a charge storage device. As the device is connected to a load, the discharge will take place immediately within a short period of time, give rise to a current boost which is needed for initializing certain applications.

2.9 Band Diagram of the Hybrid Device Referred to under Item 2.6

Figure 12:
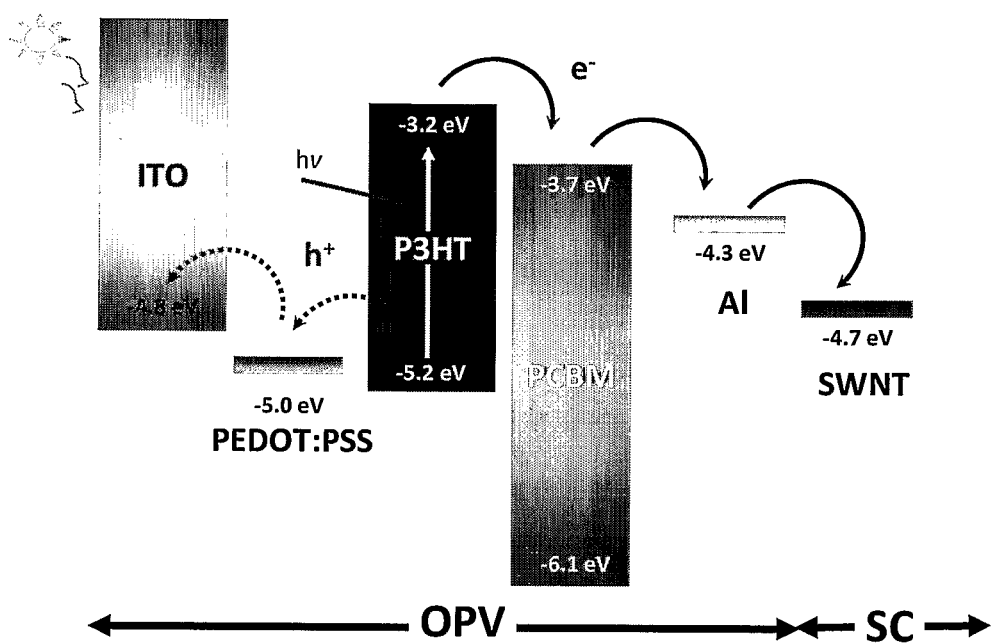
FIG. 12 shows a band diagram and illustrates how charges are transported in a hybrid OPV-SC device.

The band diagram in FIG. 12 illustrates the electrons and holes transfer of the hybrid device with Al+CNT shared electrode. Photon (hv) is absorbed by P3HT which upon excitation will generate excitons. These excitons can get dissociated to produce free charges.

Holes will remain in P3HT, while electrons will be transferred to PCBM. Due to the difference in work functions of the electrodes, both charges will be driven towards the electrodes. Transport of holes from HOMO level of P3HT is facilitated by the presence of PEDOT:PSS before it reaches ITO anode. On the other hand, electrons from LUMO level of PCBM are transported towards Al cathode. Upon reaching electrodes, charges can get into SWCNT and stored in the supercapacitor.

The invention claimed is:
1. A hybrid device comprising:
an energy converting unit comprising a first electrode, a second electrode and an energy converting medium arranged between the first electrode and the second electrode, wherein the energy conversion takes place between the first electrode and the second electrode of the energy converting unit;
an energy charge storing unit comprising a first electrode, a second electrode and an electrolyte medium arranged between the first electrode and the second electrode;
wherein:
the energy charge is stored between the first and the second electrode of the energy charge storing unit;
the second electrode of the energy converting unit and the second electrode of the energy charge storing unit being a shared electrode electrically connecting the energy converting unit and the energy charge storing unit;

materials of the shared electrode comprise a metal and a nanostructured material, with at least one dimension of the nanostructured material being in the nanometer range;

the metal of the shared electrode forms a first layer;

the first layer forms one side of the shared electrode in direct contact with the energy converting medium of the energy converting unit;

the nanostructured material forms a second layer arranged on the first layer; and the second layer forms another side of the shared electrode in direct contact with the electrolyte medium of the energy charge storing unit.

2. The hybrid device of claim 1, wherein the shared electrode is transparent or translucent or opaque.

3. The hybrid device of claim 1, wherein the shared electrode has a thickness of between about 10 nm to about 200 nm.

4. The hybrid device of claim 1, wherein the energy converting unit, the energy charge storing unit and the shared electrode are made of printable materials.

5. The hybrid device of claim 1, wherein the energy converting unit is selected from the group consisting of a fuel cell, a photovoltaic cell, a thermoelectric converter and a piezoelectric converter.

6. The hybrid device of claim 5, wherein the photovoltaic cell is selected from the group consisting of a thin film photovoltaic cell and a silica based photovoltaic cell.

7. The hybrid device of claim 6, wherein the photovoltaic material used in the thin film photovoltaic cell is selected from the group consisting of cadmium telluride (CdTe), copper indium gallium selenide (CIS or CIGS), dye-sensitized photovoltaic cell (DSC) material, organic photovoltaic cell material or thin-film silicon (TF-Si).

8. The hybrid device of claim 1, wherein the energy charge storing unit is a rechargeable battery or a supercapacitor or a hybrid electrochemical capacitor (HEC).

9. The hybrid device of claim 1, wherein the energy converting unit is an organic photovoltaic cell.

10. The hybrid device of claim 1, wherein the energy charge storing unit is a supercapacitor.

11. The hybrid device of claim 1, wherein the metal can be selected from the group consisting of a noble metal, a metal oxide, a metal alloy, an intermetallic, and mixtures thereof.

12. The hybrid device of claim 11, wherein the noble metal is selected from the group consisting of silver, palladium, gold, platinum and mixtures thereof.

13. The hybrid device of claim 11, wherein the metal oxide is selected from the group consisting of $PtO_2$, $V_2O_3$, $V_2O_5$, $Nb_2O_5$, $NiO_2 \cdot xH_2O$, $LiCoO_2$, $LiFeO_2$, $LiMn_2O_3$, $Li_2MoO_4$, $Li_2TiO_3$, $MnO_2$, $Ag-MnO_2$, $Al_2O_3$, $MoO_3$, $TiO_2$, $SiO_2$, $ZnO_2$, $SnO_2$, $Fe_2O_3$, $NiO$, $Co_3O_4$, $CoO$, $Nb_2O_5$, $W_2O_3$ and mixtures thereof.

14. The hybrid device of claim 11, wherein the alloy is made of elements selected from the group of elements consisting of group 10, 11, 12, 13, 14 and 16 of the periodic system (IUPAC nomenclature).

15. The hybrid device of claim 14, wherein the alloy is selected from the group consisting of alloys of lithium/aluminium, Au, Pt, Pd, Cu, In, InSe, CuSe and $SnS_2$.

16. The hybrid device of claim 11, wherein the intermetallic is selected from the group consisting of Ag—Ni and Ag—Au.

17. The hybrid device of claim 1, wherein the first layer of metal has a thickness of at least 100 nm.

18. The hybrid device of claim 1, wherein the metal is in the form of metal particles.

19. The hybrid device of claim 18, wherein the metal particles have a maximal dimension of <100 nm.

20. The hybrid device of claim 19, wherein the metal particles have a maximal dimension of between about 1 nm to about 40 nm.

21. The hybrid device of claim 19, wherein the metal particles have a maximal dimension of between about 1 nm to about 20 nm.

22. The hybrid device of claim 20, wherein the particle size distribution for particles with a size of between about ≥12 nm to 20 nm is about ±5 nm; wherein the particle size distribution for particles with a size of between about ≥5 nm to <12 nm is about ±3 nm and wherein the particle size distribution for particles with a size of between about 2 nm to <5 nm is about ±1 nm.

23. The hybrid device of claim 18, wherein the metal particles are mixed with the nanostructured material.

24. The hybrid device of claim 18, wherein the metal particles are chemically bound to the surface of the nanostructured material.

25. The hybrid device of claim 24, wherein the metal particles are chemically bound to the surface of the nanostructured material via a linker.

26. The hybrid device of claim 25, wherein the linker is selected from the group consisting of a hydroxyl group, pyrenes, esters, thiols, amines, a carboxyl group and mixtures thereof.

27. The hybrid device of claim 26, wherein the carboxyl group is comprised in a molecule selected from the group consisting of formic acid, acetic acid, propionic acid, butanoic acid, pentanoic acid, hexanoic acid, cycloalkane carboxylic acids and benzoic acids.

28. The hybrid device of claim 26, wherein said hydroxyl group is comprised in a molecule selected from the group consisting of phosphoric acid and sulfonic acid.

29. The hybrid device of claim 23, wherein between about 5% to about 80% of the surface of the nanostructured material is covered with the metal particles.

30. The hybrid device of claim 23, wherein the particles are evenly dispersed at the surface of the nanostructured material.

31. The hybrid device of claim 1, wherein the nanostructured material has a surface area of at least about 50 $m^2/g$.

32. The hybrid device of claim 1, wherein at least one dimension of the nanostructured material is less than 100 nm.

33. The hybrid device of claim 1, wherein the nanostructured material is selected from the group consisting of nanotubes, nanowires, nanoflakes, nanoparticles, nanodiscs, nanofilms and combinations of the aforementioned nanostructured materials in a mixture.

34. The hybrid device of claim 33, wherein the nanotubes are single-walled or double-walled or multi-wall nanotubes.

35. The hybrid device of claim 34, wherein the nanotubes are carbon nanotubes.

36. The hybrid device of claim 1 wherein the nanostructured material is made of a material selected from the group consisting of a carbon material, a ceramic, glass, aluminium oxynitride; a polypyrrole and mixtures of nanostructured materials made of different of the aforementioned materials.

37. The hybrid device of claim 1, wherein the nanostructured material is a mesoporous or macroporous nanostructured material.

38. The hybrid device of claim 1, wherein the metal is in form of metal particles and wherein the shared electrode comprises:
- a first layer of the nanostructured material mixed with the metal particles or a first layer of the metal particles bound to the surface of the nanostructured material;
- a second layer of the nanostructured material arranged on the first layer.

39. The hybrid device of claim 38, wherein the first layer of the nanostructured material mixed with the metal particles or the first layer of the metal particles bound to the surface of the nanostructured material is arranged on the energy converting medium, wherein the second layer of the nanostructured material is arranged between the first layer and the electrolyte medium of the energy charge storing unit.

40. The hybrid device of claim 1, wherein the hybrid device comprises at least two energy converting units, wherein the at least two energy converting units are connected to each other in series; wherein the first energy converting unit in the series comprises the shared electrode which is electrically connecting the first energy converting unit to the energy charge storing unit.

41. The hybrid device of claim 1, wherein:
- the hybrid device comprises at least two energy converting units and at least one energy charge storing unit;
- the at least one energy charge storing unit is arranged between the at least two energy converting units;
- the shared electrode is electrically connecting the electrolyte medium and the energy converting medium of the at least two energy converting units and the at least one energy charge storing unit; and
- the first electrode of the at least one energy charge storing unit is electrically connected to the first electrode of the energy converting units.

42. A method of manufacturing a hybrid device comprising a layered structure of a first component, a second component and a third component, comprising:
- forming the first component which comprises either:
    - depositing an energy converting unit, wherein the energy converting unit comprises an energy converting medium layer arranged on a first electrode layer, or
    - depositing an energy charge storing unit, wherein the energy charge storing unit comprises an electrolyte medium layer arranged on a first electrode layer;
- forming the second component which comprises depositing a second electrode layer being a shared electrode on the energy converting medium layer or the electrolyte medium layer;
    wherein the second electrode layer comprises a metal and a nanostructured material;
- forming the third component which comprises either
    - depositing an energy converting medium layer on the second electrode layer and depositing a further electrode layer on the energy converting medium layer if the first component is an energy charge storing unit; or
    - depositing an electrolyte layer on the second electrode layer and depositing a further electrode layer on the electrolyte layer if the first component is an energy converting unit, wherein:
- the metal of the shared electrode forms a first layer;
- the first layer forms one side of the shared electrode in direct contact with the energy converting medium of the energy converting unit;
- the nanostructured material forms a second layer arranged on the first layer; and
- the second layer forms another side of the shared electrode in direct contact with the electrolyte medium of the energy storing unit.

43. The method of claim 42, wherein the shared electrode is formed by:
- depositing the metal as a metal layer on either the energy converting medium layer of the first component or the electrolyte medium layer of the first component; and
- depositing the nanostructured material as a nanostructured material layer on the metal layer.

44. The method of claim 42, wherein the metal is in form of particles and wherein the particles are mixed with the nanostructured material.

45. The method of claim 42, wherein the metal is in form of particles and wherein the particles are chemically bound to the surface of the nanostructured material.

46. The method of claim 42, wherein the metal is in form of particles.

47. The method of claim 46, wherein the shared electrode is formed by:
- depositing a first layer of the nanostructured material which is either mixed with the metal particles or wherein the metal particles are chemically bound to the surface of the nanostructured material on either the energy converting medium layer of the first component or the electrolyte medium layer of the first component; and
- depositing a second layer of a nanostructured material on the first layer.

* * * * *